(12) United States Patent
Nakamura et al.

(10) Patent No.: US 12,255,635 B2
(45) Date of Patent: Mar. 18, 2025

(54) ACOUSTIC WAVE DEVICE, AND LADDER FILTER INCLUDING THE SAME

(71) Applicant: Murata Manufacturing Co., Ltd., Nagaokakyo (JP)

(72) Inventors: Kentaro Nakamura, Nagaokakyo (JP); Shinichi Okada, Nagaokakyo (JP); Syunsuke Kido, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 314 days.

(21) Appl. No.: 17/869,808

(22) Filed: Jul. 21, 2022

(65) Prior Publication Data

US 2022/0352874 A1    Nov. 3, 2022

Related U.S. Application Data

(63) Continuation of application No. PCT/JP2021/003249, filed on Jan. 29, 2021.

(30) Foreign Application Priority Data

Jan. 31, 2020    (JP) .................................. 2020-015068

(51) Int. Cl.
*H03H 9/64*    (2006.01)
*H03H 9/02*    (2006.01)
(Continued)

(52) U.S. Cl.
CPC ...... *H03H 9/6483* (2013.01); *H03H 9/02574* (2013.01); *H03H 9/02842* (2013.01); *H03H 9/145* (2013.01); *H03H 9/25* (2013.01)

(58) Field of Classification Search
CPC ............. H03H 9/6483; H03H 9/02574; H03H 9/02842; H03H 9/145; H03H 9/25;
(Continued)

(56) References Cited

U.S. PATENT DOCUMENTS

2007/0046399 A1    3/2007    Yoneya
2011/0032051 A1    2/2011    Kawamoto et al.
(Continued)

FOREIGN PATENT DOCUMENTS

JP    03283710 A    12/1991
JP    10303691 A    11/1998
(Continued)

OTHER PUBLICATIONS

International Search Report in PCT/JP2021/003249, mailed Mar. 30, 2021, 3 pages.
(Continued)

Primary Examiner — Jorge L Salazar, Jr.
(74) Attorney, Agent, or Firm — Keating & Bennett, LLP

(57) ABSTRACT

An acoustic wave device includes a substrate, a first resonator, a second resonator, and a shared reflector. The second resonator is adjacent to the first resonator and has different frequency characteristics different than the first resonator. The first resonator includes a first interdigital transducer electrode. The second resonator includes a second interdigital transducer electrode. The shared reflector has frequency characteristics that are the same as both frequency characteristics of the first resonator and frequency characteristics of the second resonator or between the frequency characteristics of the first resonator and the frequency characteristics of the second resonator. a higher-order mode frequency of the first resonator and a higher-order mode frequency of the second resonator coincides. When the number of electrode fingers of the shared reflector is even, an electrode finger facing the shared reflector in the first interdigital transducer electrode and an electrode finger facing the shared reflector in the second interdigital transducer electrode have the same polarity. When the number of electrode fingers of the shared reflector is odd, an electrode (Continued)

finger facing the shared reflector in the first interdigital transducer electrode and an electrode finger facing the shared reflector in the second interdigital transducer electrode have opposite polarities.

20 Claims, 22 Drawing Sheets

(51) Int. Cl.
    *H03H 9/145*     (2006.01)
    *H03H 9/25*     (2006.01)

(58) Field of Classification Search
    CPC ........... H03H 9/14547; H03H 9/14594; H03H 9/02771; H03H 9/02637; H03H 9/14541
    USPC .......................................... 333/133, 193–196
    See application file for complete search history.

(56) References Cited

U.S. PATENT DOCUMENTS

| | | |
|---|---|---|
| 2016/0065175 A1 | 3/2016 | Takamine |
| 2021/0265970 A1* | 8/2021 | Yamaji ............... H03H 9/02842 |

FOREIGN PATENT DOCUMENTS

| | | |
|---|---|---|
| JP | 2000224003 A | 8/2000 |
| JP | 2007060331 A | 3/2007 |
| JP | 2009273120 A | 11/2009 |
| JP | 2010193135 A | 9/2010 |
| JP | 2010263296 A | 11/2010 |
| WO | 2014199683 A1 | 12/2014 |

OTHER PUBLICATIONS

Written Opinion in PCT/JP2021/003249, mailed Mar. 30, 2021, 3 pages.

* cited by examiner

FIG.11

FREQUENCY SENSITIVITY RATIO

|  | WAVELENGTH | PIEZOELECTRIC LAYER FILM THICKNESS | ELECTRODE FILM THICKNESS | Duty |
|---|---|---|---|---|
| MAIN MODE RESONANT FREQUENCY | −1.00 | 1.00 | −1.00 | −1.00 |
| HIGHER MODE FREQUENCY | −0.67 | −2.40 | −0.70 | −0.55 |

FIG. 14A (a) COMPARATIVE EXAMPLE

|  | RESONATOR 2 | | SHARED REFLECTOR | RESONATOR 1 | |
|---|---|---|---|---|---|
|  | IDT | REFLECTOR |  | REFLECTOR | IDT |
| NUMBER OF PAIRS OF ELECTRODE FINGERS OF IDT | 90 | — | — | — | 130 |
| OVERLAP WIDTH [μm] | 50.59 | — | 50.59 | — | 25.29 |
| WAVELENGTH λ [μm] | 1.62013 | 1.62013 | 1.5495~1.62013 | 1.5495 | 1.5495 |
| NUMBER OF ELECTRODE FINGERS OF IDT | 181 | 10 | 8 | 10 | 261 |
| PIEZOELECTRIC LAYER THICKNESS [nm] | 600 | 600 | 600 | 600 | 600 |
| DUTY | 0.5 | 0.5 | 0.5 | 0.5 | 0.5 |
| MAIN MODE RESONANT FREQUENCY | 2361.513[MHz] | | — | 2464.282[MHz] | |
| HIGHER MODE FREQUENCY | 3019.257[MHz] | | — | 3106.941[MHz] | |

FIG. 14B (b) EXAMPLE

|  | RESONATOR 2 | | SHARED REFLECTOR | RESONATOR 1 | |
|---|---|---|---|---|---|
|  | IDT | REFLECTOR |  | REFLECTOR | IDT |
| NUMBER OF PAIRS OF ELECTRODE FINGERS OF IDT | 90 | — | — | — | 130 |
| OVERLAP WIDTH [μm] | 50.59 | — | 50.59 | — | 25.29 |
| WAVELENGTH λ [μm] | 1.60700 | 1.60700 | 1.5495~1.60700 | 1.5495 | 1.5495 |
| NUMBER OF ELECTRODE FINGERS OF IDT | 181 | 10 | 8 | 10 | 261 |
| PIEZOELECTRIC LAYER THICKNESS [nm] | 500 | 500 | 500~600 | 600 | 600 |
| DUTY | 0.5 | 0.5 | 0.5 | 0.5 | 0.5 |
| MAIN MODE RESONANT FREQUENCY | 2361.312[MHz] | | — | 2464.282[MHz] | |
| HIGHER MODE FREQUENCY | 3107.580[MHz] | | — | 3106.941[MHz] | |

FIG. 17A (a) COMPARATIVE EXAMPLE

| | RESONATOR 2 | | SHARED REFLECTOR | RESONATOR 1 | |
|---|---|---|---|---|---|
| | IDT | REFLECTOR | | REFLECTOR | IDT |
| NUMBER OF PAIRS OF ELECTRODE FINGERS OF IDT | 130 | — | — | — | 130 |
| OVERLAP WIDTH [μm] | 25.29 | — | 25.29 | — | 25.29 |
| WAVELENGTH λ [μm] | 1.5458813 | 1.5458813 | 1.5458813 ~1.5495 | 1.5495 | 1.5495 |
| NUMBER OF ELECTRODE FINGERS OF IDT | 181 | 10 | 8 | 10 | 261 |
| DUTY | 0.5 | 0.5 | 0.5 | 0.5 | 0.5 |
| MAIN MODE RESONANT FREQUENCY | 2469.837[MHz] | | — | 2464.282[MHz] | |
| HIGHER MODE FREQUENCY | 3111.626[MHz] | | — | 3106.941[MHz] | |

FIG. 17B (b) EXAMPLE

| | RESONATOR 2 | | SHARED REFLECTOR | RESONATOR 1 | |
|---|---|---|---|---|---|
| | IDT | REFLECTOR | | REFLECTOR | IDT |
| NUMBER OF PAIRS OF ELECTRODE FINGERS OF IDT | 130 | — | — | — | 130 |
| OVERLAP WIDTH [μm] | 25.29 | — | 25.29 | — | 25.29 |
| WAVELENGTH λ [μm] | 1.559226 | 1.559226 | 1.559226 ~1.5495 | 1.5495 | 1.5495 |
| NUMBER OF ELECTRODE FINGERS OF IDT | 181 | 10 | 8 | 10 | 261 |
| DUTY | 0.4 | 0.4 | 0.4~0.5 | 0.5 | 0.5 |
| MAIN MODE RESONANT FREQUENCY | 2469.837[MHz] | | — | 2464.282[MHz] | |
| HIGHER MODE FREQUENCY | 3106.941[MHz] | | — | 3106.941[MHz] | |

FIG. 20A (a) COMPARATIVE EXAMPLE

|  | RESONATOR 2 | | SHARED REFLECTOR | RESONATOR 1 | |
| --- | --- | --- | --- | --- | --- |
|  | IDT | REFLECTOR |  | REFLECTOR | IDT |
| ELECTRODE FILM THICKNESS [nm] | 121 | | 121 | 121 | |
| NUMBER OF PAIRS OF ELECTRODE FINGERS OF IDT | 130 | — | — | — | 130 |
| OVERLAP WIDTH [μm] | 25.29 | — | 25.29 | — | 25.29 |
| WAVELENGTH λ [μm] | 1.54666 | 1.54666 | 1.54666 ~1.5495 | 1.5495 | 1.5495 |
| NUMBER OF ELECTRODE FINGERS OF IDT | 210 | 10 | 8 | 10 | 261 |
| DUTY | 0.5 | 0.5 | 0.5 | 0.5 | 0.5 |
| MAIN MODE RESONANT FREQUENCY | 2468.655[MHz] | | — | 2464.282[MHz] | |
| HIGHER MODE FREQUENCY | 3110.629[MHz] | | — | 3106.941[MHz] | |

FIG. 20B (b) EXAMPLE

|  | RESONATOR 2 | | SHARED REFLECTOR | RESONATOR 1 | |
| --- | --- | --- | --- | --- | --- |
|  | IDT | REFLECTOR |  | REFLECTOR | IDT |
| ELECTRODE FILM THICKNESS [nm] | 191 | | 121~191 | 121 | |
| NUMBER OF PAIRS OF ELECTRODE FINGERS OF IDT | 130 | — | — | — | 130 |
| OVERLAP WIDTH [μm] | 25.29 | — | 25.29 | — | 25.29 |
| WAVELENGTH λ [μm] | 1.48439 | 1.48439 | 1.48439 ~1.5495 | 1.5495 | 1.5495 |
| NUMBER OF ELECTRODE FINGERS OF IDT | 210 | 10 | 8 | 10 | 261 |
| DUTY | 0.5 | 0.5 | 0.5 | 0.5 | 0.5 |
| MAIN MODE RESONANT FREQUENCY | 2468.227[MHz] | | — | 2464.282[MHz] | |
| HIGHER MODE FREQUENCY | 3107.036[MHz] | | — | 3106.941[MHz] | |

ACOUSTIC WAVE DEVICE, AND LADDER FILTER INCLUDING THE SAME

CROSS REFERENCE TO RELATED APPLICATIONS

This application claims the benefit of priority to Japanese Patent Application No. 2020-015068 filed on Jan. 31, 2020 and is a Continuation Application of PCT Application No. PCT/JP2021/003249 filed on Jan. 29, 2021. The entire contents of each application are hereby incorporated herein by reference.

BACKGROUND OF THE INVENTION

1. Field of the Invention

The present disclosure relates to an acoustic wave device and a ladder filter including the same and, more specifically, to a technology for reducing the size of an acoustic wave device.

2. Description of the Related Art

Japanese Unexamined Patent Application Publication No. 10-303691 describes a filter device made up of a plurality of surface acoustic wave (SAW) resonators. Generally, in such a filter device, to reduce leakage of signals, to be propagated through the surface acoustic wave resonators, from the resonators, reflectors are disposed on both sides of an IDT (interdigital transducer) electrode that is a component of each of the surface acoustic wave resonators.

SUMMARY OF THE INVENTION

Filter devices that use surface acoustic wave resonators as described above can be used in mobile terminals, typically, for example, mobile phones or smartphones. In mobile terminals, there are still great needs for size reduction and thickness reduction, and, accordingly, devices, such as filter devices, that are components of the mobile terminals are also desired for further size reduction and low profile.

For such an inconvenience, for example, Japanese Unexamined Patent Application Publication No. 2002-176335 suggests a configuration in which the overall size of an acoustic wave device is reduced by sharing a reflector disposed between interdigital transducer electrodes of adjacent surface acoustic wave resonators.

On the other hand, in acoustic wave devices, a higher-order mode spurious response with a frequency different from a frequency band (a vibration mode that contributes to a pass band is defined as a main mode) to be passed can occur. The higher-order mode spurious response is possibly not able to be removed by reflectors, and, in such a case, a signal of the higher-order mode can affect an adjacent one of the acoustic wave resonators.

Preferred embodiments of the present invention provide acoustic wave devices each including a plurality of resonators and each achieving size reduction while reducing the influence of higher-order mode spurious responses in the device.

An acoustic wave device according to a first aspect of a preferred embodiment of the present disclosure includes a substrate including a piezoelectric layer, a first resonator and a second resonator on the substrate, and a shared reflector. The second resonator is on the substrate adjacent to the first resonator and has frequency different characteristics than the first resonator. The shared reflector is on the substrate between the first resonator and the second resonator. The first resonator includes a first interdigital transducer electrode including electrode fingers positioned with a first pitch. The second resonator includes a second interdigital transducer electrode including electrode fingers positioned with a second pitch. A lower limit frequency of a stop band of the shared reflector is equal to both a lower limit frequency of a stop band of the first resonator and a lower limit frequency of a stop band of the second resonator, or between the lower limit frequency of the stop band of the first resonator and the lower limit frequency of the stop band of the second resonator. An upper limit frequency of the stop band of the shared reflector is equal to both an upper limit frequency of the stop band of the first resonator and an upper limit frequency of the stop band of the second resonator, or between the upper limit frequency of the stop band of the first resonator and the upper limit frequency of the stop band of the second resonator. A higher-order mode frequency of the first resonator coincides with a higher-order mode frequency of the second resonator. When a number of electrode fingers of the shared reflector is even, the electrode finger facing the shared reflector in the first interdigital transducer electrode has the same polarity as a polarity of the electrode finger facing the shared reflector in the second interdigital transducer electrode. When the number of electrode fingers of the shared reflector is odd, the electrode finger facing the shared reflector in the first interdigital transducer electrode has a polarity opposite to a polarity of the electrode finger facing the shared reflector in the second interdigital transducer electrode.

An acoustic wave device according to a second aspect of a preferred embodiment of the present disclosure includes a substrate including a piezoelectric layer, a first resonator and a second resonator on the substrate, and a shared reflector. The second resonator is on the substrate adjacent to the first resonator and has different frequency characteristics the first resonator. The shared reflector is on the substrate between the first resonator and the second resonator. The first resonator includes a first interdigital transducer electrode including electrode fingers positioned with a first pitch. The second resonator includes a second interdigital transducer electrode including electrode fingers including a second pitch. A main mode of each of the first resonator and the second resonator is a vibration mode in which a resonant frequency increases with an increase in a thickness of the piezoelectric layer. Where values obtained by multiplying a pitch of electrode fingers, a duty of the electrode fingers, a thickness of the electrode fingers, and an inverse number of a thickness of the piezoelectric layer for the shared reflector, the first resonator, and the second resonator are respectively a first value, a second value, and a third value, the first value is the same as both the second value and the third value or between the second value and the third value. A higher-order mode frequency of the first resonator coincides with a higher-order mode frequency of the second resonator. When a number of the electrode fingers of the shared reflector is even, the electrode finger facing the shared reflector in the first interdigital transducer electrode has the same polarity as a polarity of the electrode finger facing the shared reflector in the second interdigital transducer electrode. When the number of the electrode fingers of the shared reflector is odd, the electrode finger facing the shared reflector in the first interdigital transducer electrode has a polarity opposite to a polarity of the electrode finger facing the shared reflector in the second interdigital transducer electrode.

An acoustic wave device according to a third aspect of a preferred embodiment of the present disclosure includes a substrate including a piezoelectric layer, a first resonator and a second resonator on the substrate, and a shared reflector. The second resonator is on the substrate adjacent to the first resonator and has different frequency characteristics than the first resonator. The shared reflector is on the substrate between the first resonator and the second resonator. The first resonator includes a first interdigital transducer electrode including electrode fingers positioned with a first pitch. The second resonator includes a second interdigital transducer electrode including electrode fingers positioned with a second pitch. A main mode of each of the first resonator and the second resonator is a vibration mode in which a resonant frequency decreases with an increase in a thickness of the piezoelectric layer. Where values obtained by multiplying a pitch of electrode fingers, a duty of the electrode fingers, a thickness of the electrode fingers, and a thickness of the piezoelectric layer for the shared reflector, the first resonator, and the second resonator are respectively a fourth value, a fifth value, and a sixth value, the fourth value is the same as both the fifth value and the sixth value or between the fifth value and the sixth value. A higher-order mode frequency of the first resonator coincides with a higher-order mode frequency of the second resonator. When the number of the electrode fingers of the shared reflector is even, the electrode finger facing the shared reflector in the first interdigital transducer electrode has the same polarity as a polarity of the electrode finger facing the shared reflector in the second interdigital transducer electrode. When the number of the electrode fingers of the shared reflector is odd, the electrode finger facing the shared reflector in the first interdigital transducer electrode has a polarity opposite to a polarity of the electrode finger facing the shared reflector in the second interdigital transducer electrode.

With an acoustic wave device according to a preferred embodiment of the present disclosure, between two acoustic wave resonators (the first resonator and the second resonator) each including the interdigital transducer electrode, the shared reflector that defines and functions as a reflector for both resonators is provided. The shared reflector has frequency characteristics between the frequency characteristics of the first resonator and the frequency characteristics of the second resonator. When the number of the electrode fingers of the shared reflector is even, the electrode fingers each facing the shared reflector in the two resonators are disposed so as to have mutually the same polarity. When the number of the electrode fingers of the shared reflector is odd, the electrode fingers each facing the shared reflector in the two resonators are disposed so as to have mutually opposite polarities. With such a configuration, higher-order mode spurious responses that occur in the respective resonators cancel out each other, so, in the acoustic wave device, it is possible to implement size reduction while reducing the influence of higher-order mode spurious responses.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 11 is a table showing a frequency sensitivity ratio of a higher-order mode to the structural parameters of a resonator.

FIGS. 14A and 14B show tables respectively showing the specifications of an example and a comparative example of the acoustic wave device according to the first example.

FIGS. 17A and 17B show tables respectively showing the specifications of an example and a comparative example of the acoustic wave device according to the second example.

FIGS. 20A and 20B show tables respectively showing the specifications of an example and a comparative example of the acoustic wave device according to the third example.

DETAILED DESCRIPTION OF THE PREFERRED EMBODIMENTS

Figure 1:
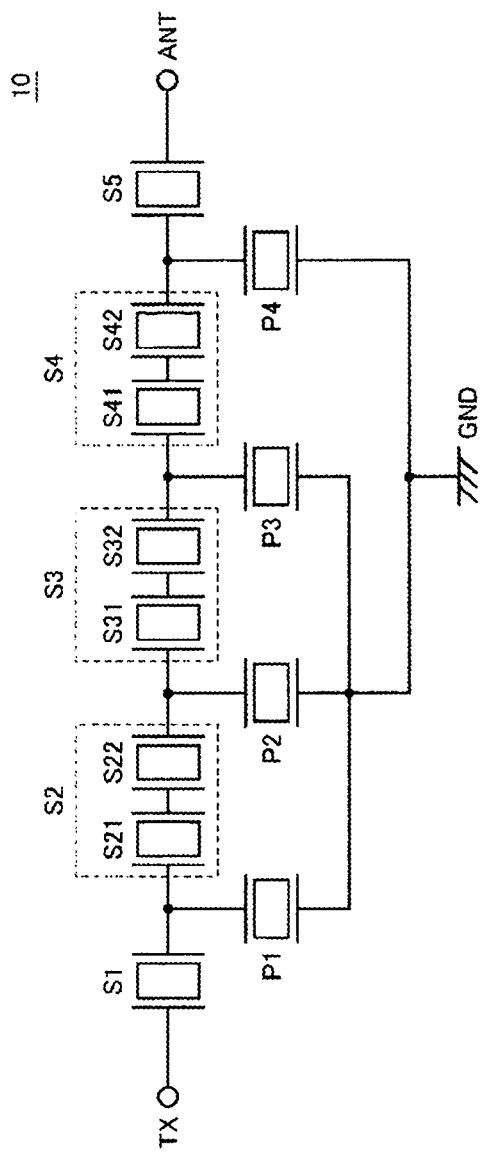
FIG. 1 is a circuit configuration of a filter device including acoustic wave devices according to a first preferred embodiment of the present invention.

Hereinafter, preferred embodiments of the present disclosure will be described in detail with reference to the drawings. Like reference signs denote the same or corresponding portions in the drawings, and the description thereof will not be repeated.

First Preferred Embodiment

Configuration of Filter Device

FIG. 1 is a diagram showing the circuit configuration of a filter device 10 including acoustic wave devices according to a first preferred embodiment. The filter device 10 is a filter device preferably for use in a transmission circuit of a communication device and is a ladder filter connected between a transmission terminal TX and an antenna terminal ANT, for example. The filter device 10 filters a signal received at the transmission terminal TX and outputs the signal from the antenna terminal ANT.

The filter device 10 includes series arm resonant portions S1 to S5 connected in series between the transmission terminal TX and the antenna terminal ANT, and parallel arm resonant portions P1 to P4. Each of the series arm resonant portions S1 to S5 and the parallel arm resonant portions P1 to P4 is configured to include at least one acoustic wave resonator. In the example of FIG. 1, each of the series arm resonant portions S1, S5 and the parallel arm resonant portions P1 to P4 includes a single acoustic wave resonator, and each of the series arm resonant portions S2 to S4 includes two acoustic wave resonators. The series arm resonant portion S2 is configured to include acoustic wave resonators S21, S22 connected in series. The series arm resonant portion S3 is configured to include acoustic wave resonators S31, S32 connected in series. The series arm resonant portion S4 is configured to include acoustic wave resonators S41, S42 connected in series. The number of acoustic wave resonators included in each resonant portion is not limited thereto and may be selected as needed so as to be adapted to the characteristics of the filter device. A surface acoustic wave (SAW) resonator may be used as the acoustic wave resonator.

One end of the parallel arm resonant portion P1 is connected to a junction point between the series arm resonant portion S1 and the series arm resonant portion S2, and the other end is connected to a ground potential GND. One end of the parallel arm resonant portion P2 is connected to a junction point between the series arm resonant portion S2 and the series arm resonant portion S3, and the other end is connected to the ground potential GND. One end of the parallel arm resonant portion P3 is connected to a junction point between the series arm resonant portion S3 and the series arm resonant portion S4, and the other end is connected to the ground potential GND. One end of the parallel arm resonant portion P4 is connected to a junction point between the series arm resonant portion S4 and the series arm resonant portion S5, and the other end is connected to the ground potential GND.

Configuration of Acoustic Wave Device

Figure 2:
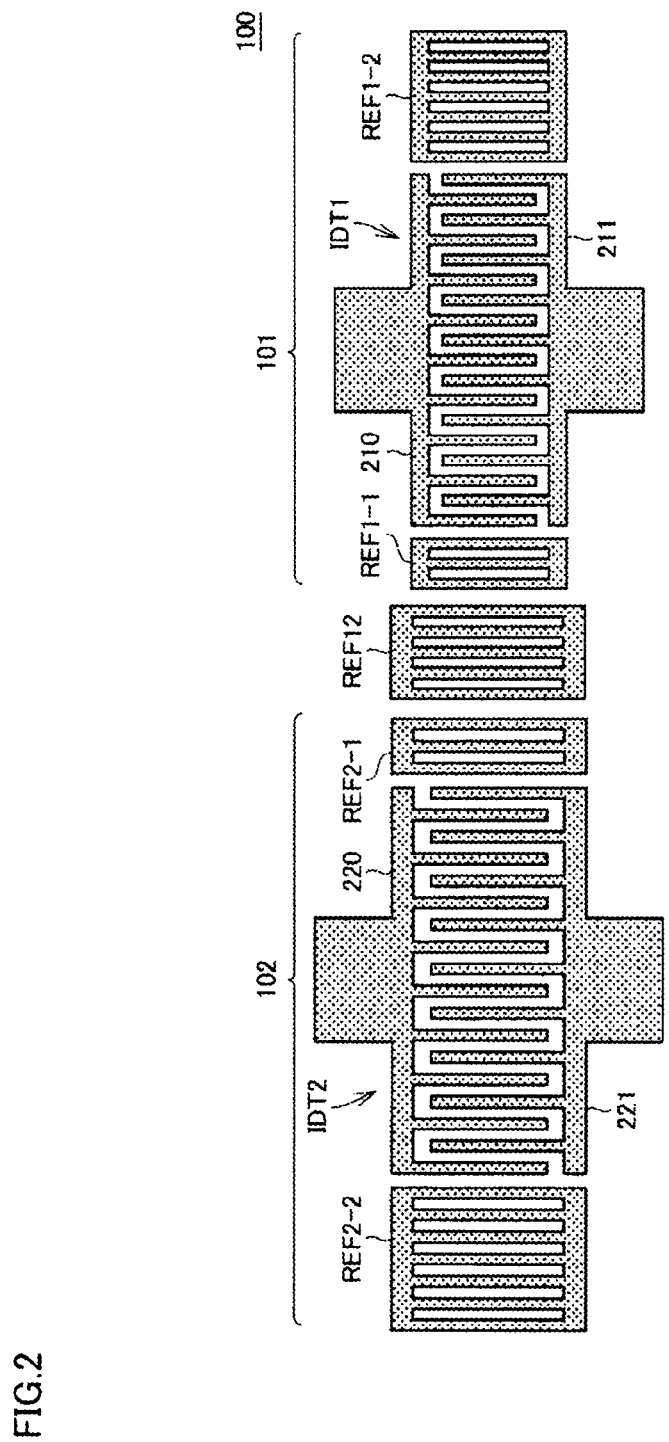
FIG. 2 is a top view for illustrating the configuration of a portion where a shared reflector is included in the acoustic wave device according to the first preferred embodiment of the present invention.
Figure 3:
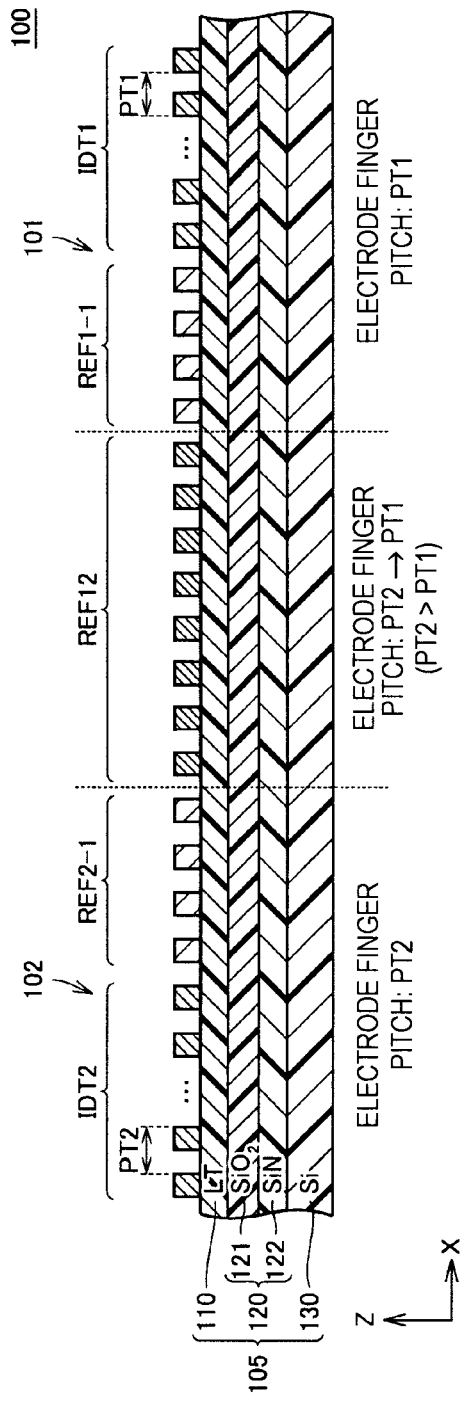
FIG. 3 is a cross-sectional view of the acoustic wave device according to the first preferred embodiment of the present invention.

Next, the basic configuration of an acoustic wave device 100 according to the first preferred embodiment will be described with reference to FIG. 2 and FIG. 3. FIG. 2 is a top view of a portion where a shared reflector is between adjacent resonators in the acoustic wave device 100. FIG. 3 is a cross-sectional view of the portion between the adjacent resonators.

As shown in FIG. 2 and FIG. 3, the acoustic wave device 100 includes adjacent two acoustic wave resonator 101 (first resonator) and acoustic wave resonator 102 (second resonator), and a shared reflector REF12. Each of the acoustic wave resonators 101, 102 included in the acoustic wave device 100 corresponds to the resonator included in any one of the series arm resonant portions S1 to S5 and the parallel arm resonant portions P1 to P4 in the filter device 10 illustrated in FIG. 1.

Each of the acoustic wave resonators 101, 102 is an SAW resonator configured to include an interdigital transducer electrode. Specifically, the acoustic wave resonator 101 includes an interdigital transducer electrode IDT1, and reflectors REF1-1, REF1-2 disposed on both sides of the interdigital transducer electrode IDT1. The acoustic wave resonator 102 includes an interdigital transducer electrode IDT2, and reflectors REF2-1, REF2-2 disposed on both sides of the interdigital transducer electrode IDT2.

The interdigital transducer electrode has such a configuration that two comb-shaped electrodes in each of which electrode fingers are connected on a busbar at predetermined intervals face each other. The interdigital transducer electrode IDT1 of the acoustic wave resonator 101 includes a busbar 210 (first busbar) and a busbar 211 (second busbar). The interdigital transducer electrode IDT2 of the acoustic wave resonator 102 includes a busbar 220 (third busbar) and a busbar 221 (fourth busbar).

In the interdigital transducer electrode, surface acoustic waves propagate in a direction orthogonal to a direction in which the facing electrode fingers extend. The reflectors are used to trap surface acoustic waves having leaked from the end portions of the interdigital transducer electrode in the interdigital transducer electrode by reflecting the surface acoustic waves. Thus, the quality factor of the acoustic wave resonator is enhanced.

As shown in FIG. 3, the interdigital transducer electrode and the reflectors included in each of the acoustic wave resonators are located on the substrate 105 including the piezoelectric layer 110. The substrate 105 includes a low acoustic velocity layer 121, a high acoustic velocity layer 122, and a support layer 130 in addition to the piezoelectric layer 110.

The support layer 130 is a semiconductor substrate made of, for example, silicon (Si). The high acoustic velocity layer 122, the low acoustic velocity layer 121, and the piezoelectric layer 110 are laminated on the support layer 130 in order in the positive direction of the Z-axis in FIG. 3.

The piezoelectric layer 110 is made of, for example, a piezoelectric monocrystal material, such as lithium tantalate ($LiTaO_3$) and lithium niobate ($LiNbO_3$), or a multilayer piezoelectric material made of aluminum nitride (AlN), $LiTaO_3$, or $LiNbO_3$. The interdigital transducer electrode and the reflectors that are functional elements are formed on the top surface (the surface in the positive direction of the Z-axis) of the piezoelectric layer 110. In the example of FIG. 3, lithium tantalate (LT) is used as the piezoelectric layer 110.

The interdigital transducer electrode and the reflectors are made of, for example, a material, such as elemental metal made up of at least one of aluminum, copper, silver, gold, titanium, tungsten, platinum, chromium, nickel, and molybdenum, and alloys containing the elemental metal as a main ingredient.

The low acoustic velocity layer 121 is made of a material such that bulk waves propagate through the low acoustic velocity layer 121 at an acoustic velocity lower than bulk waves propagate through the piezoelectric layer 110. In the example of FIG. 3, the low acoustic velocity layer 121 is made of silicon dioxide ($SiO_2$). However, the low acoustic velocity layer 121 is not limited to silicon dioxide and may be made of, for example, another dielectric, such as glass, silicon oxynitride, and tantalum oxide, a chemical compound obtained by adding fluorine, carbon, boron, or the like to silicon dioxide, or the like.

The high acoustic velocity layer 122 is made of a material such that bulk waves propagate through the high acoustic velocity layer 122 at an acoustic velocity higher than acoustic waves propagate through the piezoelectric layer 110. In the example of FIG. 3, the high acoustic velocity layer 122 is made of silicon nitride (SiN). However, the high acoustic velocity layer 122 is not limited to silicon nitride and may be made of a material, such as aluminum nitride, aluminum oxide (alumina), silicon oxynitride, silicon carbide, diamondlike carbon (DLC), and diamond.

With the configuration that the low acoustic velocity layer 121 and the high acoustic velocity layer 122 are laminated on the lower side of the piezoelectric layer 110, the low acoustic velocity layer 121 and the high acoustic velocity layer 122 function as a reflection layer (mirror layer) 120. In other words, surface acoustic waves having leaked in a direction from the piezoelectric layer 110 toward the support layer 130 is reflected by the high acoustic velocity layer 122 due to a difference in propagating acoustic velocity and is trapped in the low acoustic velocity layer 121. In this way, the loss of acoustic energy of surface acoustic waves to be propagated is reduced by the reflection layer 120, so it is possible to efficiently propagate surface acoustic waves. In FIG. 3, the example in which the low acoustic velocity layer 121 and the high acoustic velocity layer 122 each include a single layer as the reflection layer 120 has been described. Alternatively, the reflection layer 120 may be configured such that a plurality of the low acoustic velocity layers 121 and a plurality of the high acoustic velocity layers 122 are alternately disposed.

Referring back to FIG. 2, the reflector REF1-1 of the acoustic wave resonator 101 is disposed so as to face the acoustic wave resonator 102-side end portion in the interdigital transducer electrode IDT1. The reflector REF1-2 is disposed so as to face the end portion across the interdigital transducer electrode IDT1 from the reflector REF1-1. The electrode fingers of each of the reflectors REF1-1, REF1-2 are positioned with the same pitch as the electrode fingers of the interdigital transducer electrode IDT1.

The reflector REF2-1 of the acoustic wave resonator 102 is disposed so as to face the acoustic wave resonator 101-side end portion in the interdigital transducer electrode IDT2. The reflector REF2-2 is disposed so as to face the end portion across the interdigital transducer electrode IDT2 from the reflector REF2-1. The electrode fingers of each of the reflectors REF2-1, REF2-2 are positioned with the same pitch as the electrode fingers of the interdigital transducer electrode IDT2.

The shared reflector REF12 is disposed between the reflector REF1-1 of the acoustic wave resonator 101 and the reflector REF2-1 of the acoustic wave resonator 102. The sum of the number of the electrode fingers of the reflector REF1-1 and the number of the electrode fingers of the shared reflector REF12 is set to the same number as the number of the electrode fingers of the reflector REF1-2. The sum of the number of the electrode fingers of the reflector REF2-1 and the number of the electrode fingers of the shared reflector REF12 is set to the same number as the number of the electrode fingers of the reflector REF2-2. The length of each of the electrode fingers of the shared reflector REF12 is longer than or equal to the overlap width of electrode fingers in the interdigital transducer electrode included in each of the acoustic wave resonator 101 and the acoustic wave resonator 102.

The frequency characteristics of the shared reflector REF12 are intermediate frequency characteristics between the frequency characteristics of the acoustic wave resonator 101 and the frequency characteristics of the acoustic wave resonator 102. With this configuration, the shared reflector REF12 defines and functions as a reflector for both the acoustic wave resonator 101 and the acoustic wave resonator 102.

In the first preferred embodiment, the intermediate frequency characteristics are implemented by forming at least a portion of the electrode fingers of the shared reflector REF12 with a pitch between the pitch (first pitch: PT1) of the electrode fingers of each of the interdigital transducer electrode IDT1 and the reflectors REF1-1, REF1-2 in the acoustic wave resonator 101 and the pitch (second pitch: PT2) of the electrode fingers of each of the interdigital transducer electrode IDT2 and the reflectors REF2-1, REF2-2 in the acoustic wave resonator 102. Here, the pitch of electrode fingers is a center-to-center distance between adjacent electrode fingers.

Frequency characteristics are able to be measured by bringing a contact pin connected to a network analyzer into contact in a state where wires connected to the resonators and the reflectors are not included as much as possible.

In the shared reflector REF12, the overall electrode fingers may be positioned with an intermediate pitch, or the pitch may be configured to be gradually changed from the acoustic wave resonator 101 toward the acoustic wave resonator 102. Alternatively, the pitch may be configured to be changed in a stepwise manner from the acoustic wave resonator 101 toward the acoustic wave resonator 102.

The reflector REF1-1 in the acoustic wave resonator 101 and the reflector REF2-1 in the acoustic wave resonator 102 are not necessarily indispensable. Alternatively, only the shared reflector REF12 may be disposed between the interdigital transducer electrode IDT1 of the acoustic wave resonator 101 and the interdigital transducer electrode IDT2 of the acoustic wave resonator 102. In this case, the number of the electrode fingers of the shared reflector REF12 is preferably the same as the number of electrode fingers of each of the reflector REF1-2 and the reflector REF2-2.

Figure 4:
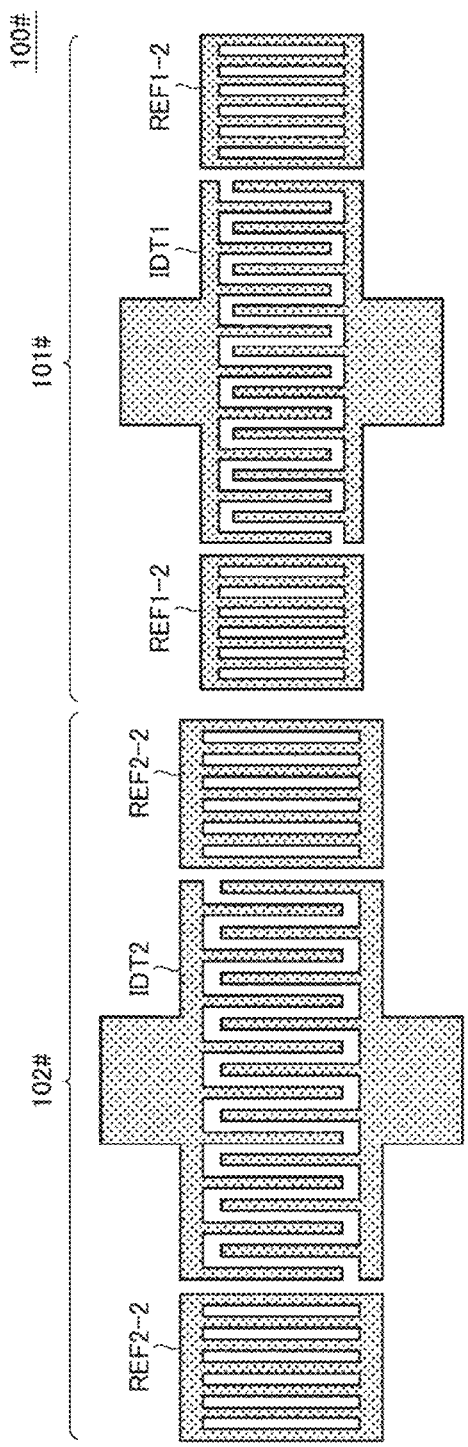
FIG. 4 is a top view of an acoustic wave device of a comparative example.

FIG. 4 is a top view of adjacent resonators in an acoustic wave device 100 # of a comparative example. The acoustic wave device 100 # includes adjacent two acoustic wave resonators 101 #, 102 #. In the acoustic wave device 100 #, reflectors (REF1-2, REF2-2) in the same shape are disposed on both sides of the interdigital transducer electrode in each acoustic wave resonator. In other words, the number of the electrode fingers of each of the reflectors disposed on both sides is the same in each of the acoustic wave resonators. Therefore, when, for example, the number of the electrode fingers of each of the reflectors REF1-2, REF2-2 is 20, the total number of the electrode fingers of the reflectors disposed between the two interdigital transducer electrodes is 40.

On the other hand, in the acoustic wave device 100 of the first preferred embodiment, when, for example, the number of the electrode fingers of each of the reflectors REF1-1, REF2-1 is eight and the number of the electrode fingers of the shared reflector REF12 is 12, the total number of the electrode fingers of the reflector REF1-1 and the shared reflector REF12 and the total number of the electrode fingers of the reflector REF2-1 and the shared reflector REF12 each are 20 and are equal to the number of the electrode fingers of each of the reflectors REF1-2, REF2-2. However, the total number of the electrode fingers of the reflector disposed between the two interdigital transducer electrodes is reduced to 28 (8+12+8). Therefore, it is possible to narrow the space between the two interdigital transducer electrodes while suppressing a decrease in reflectance by maintaining the number of the electrode fingers that function as a reflector for each of the acoustic wave resonators. Thus, in comparison with the acoustic wave device 100 # of the comparative example, the size of the acoustic wave device 100 is reduced.

In acoustic wave devices, a higher-order mode spurious response higher in frequency than a frequency band (main mode) to be passed can occur. In acoustic wave devices, generally, reflectors are designed such that a reflection coefficient for signals in the frequency band of a main mode increases. However, a reflection coefficient for the frequency band of a higher-order mode is not always able to be increased. Therefore, a higher-order mode spurious response is possibly not able to be sufficiently removed by reflectors. As a result, the higher-order mode spurious response influences an adjacent acoustic wave resonator, and a ripple may occur in filter characteristics.

For this reason, the acoustic wave device according to the first preferred embodiment adopts a configuration in which the frequency bands of higher-order modes of the acoustic wave resonators adjacent via the shared reflector are substantially brought into coincidence with each other and the phases of signals of higher-order modes that respectively occur from the acoustic wave resonators are inverted to each other. Generally, a plurality of higher-order modes occurs, and, here, the frequency band of at least one higher-order mode of the plurality of higher-order modes is brought into coincidence with each other. With such a configuration, higher-order mode spurious responses that respectively leak from the reflectors cancel out each other, so the influence of higher-order mode spurious responses is reduced.

Figure 5A:
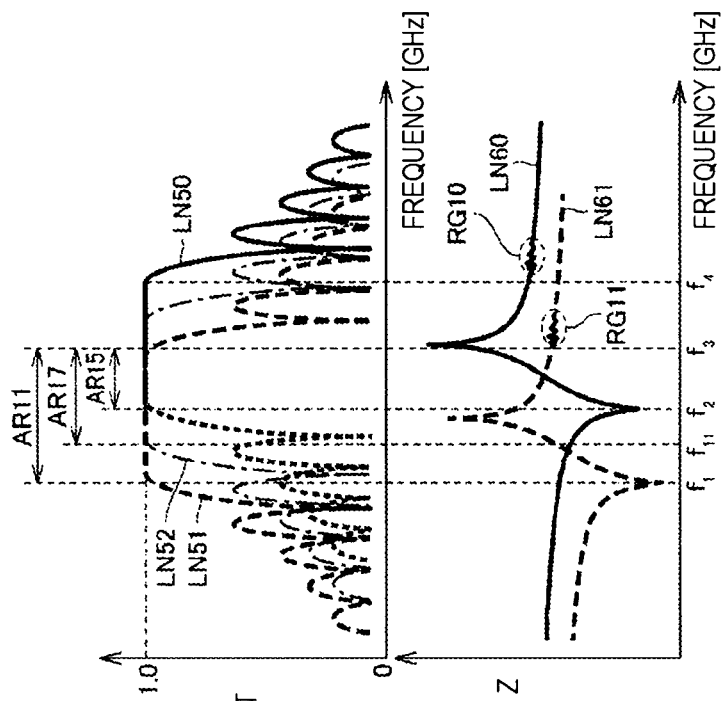
FIGS. 5A and 5B show graphs for illustrating the frequency characteristics of the acoustic wave device of the first preferred embodiment of the present invention.
Figure 5B:
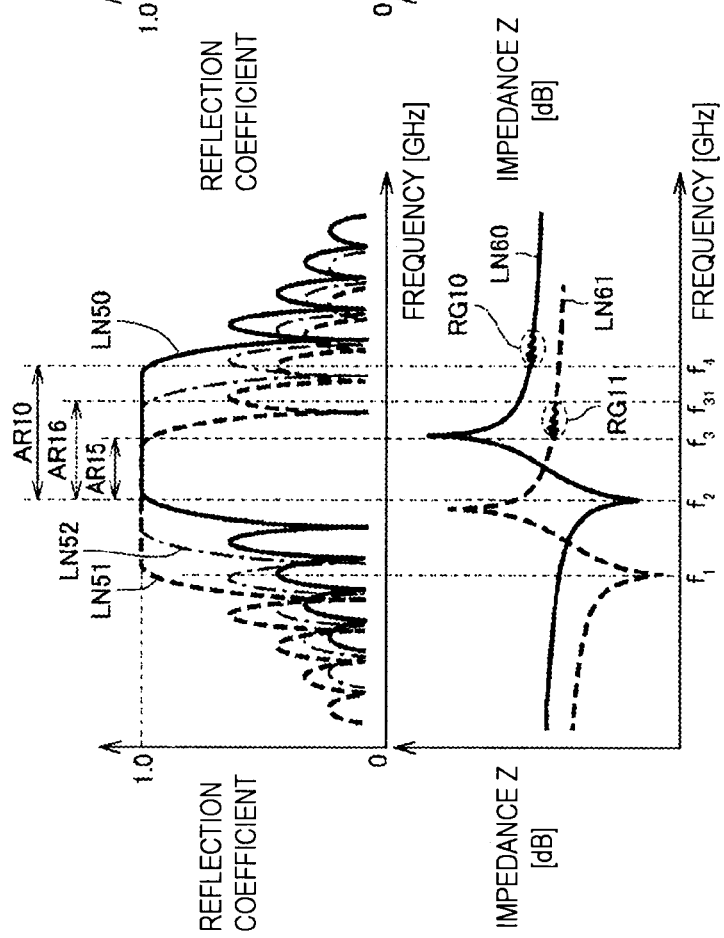

Reflection characteristics in the case where a shared reflector is used in adjacent acoustic wave resonators will be described with reference to FIGS. 5A and 5B. In each of FIG. 5A and FIG. 5B, the frequency characteristics of the reflection coefficient of each reflector are shown at the top, and the frequency characteristics of the impedance of each of the resonators is shown at the bottom. In FIGS. 5A and 5B, the continuous line LN50 and the continuous line LN60 correspond to series arm resonators, and the dashed line LN51 and the dashed line LN61 correspond to parallel arm resonators.

As shown in FIGS. 5A and 5B, a ladder filter as shown in FIG. 1 is generally designed such that the resonant frequency of each series arm resonator and the anti-resonant frequency of each parallel arm resonator substantially coincide with each other. In other words, a stop band in which the reflection coefficient is asymptotic to one in the reflectors of the series arm resonator is between frequency f2 and frequency f4 (the range AR10 in FIG. 5A. On the other hand, a stop band in which the reflection coefficient is asymptotic to one in the reflectors of the parallel arm resonator is between frequency f1 and frequency f3 (the range AR11 in FIG. 5B).

Therefore, when the reflector is shared between the series arm resonator and the parallel arm resonator and the pitch of the electrode fingers of the reflector is set to the electrode finger pitch of the interdigital transducer electrode of any one of the resonators, the reflectance is ensured in the range between frequency f2 and frequency f4 (range AR15) but the reflectance can significantly decrease in the range between frequency f1 and frequency f2 or in the range between frequency f3 and frequency f4. As a result, in the range in which the reflectance decreases, surface acoustic waves from one of the resonators are not reflected and leak to the other one of the resonators, so the deterioration of filter characteristics can occur.

On the other hand, as in the case of the first preferred embodiment, when at least a portion of the electrode finger pitch of the shared reflector is set to an intermediate pitch between the electrode finger pitches of the two resonators, the reflection coefficient of the shared reflector is, for example, as indicated by the alternate long and short dashed line LN52 in FIGS. 5A and 5B. As a result, as shown in FIG. 5A, a stop band for the series arm resonator is expanded to the range between frequency f2 and frequency f31 (range AR16). Similarly, a stop band for the parallel arm resonator is expanded to the range between frequency f11 and frequency f3 (range AR17) as shown in FIG. 5B. In other words, a lower limit frequency of the stop band of the shared reflector is between a lower limit frequency of the stop band of the first resonator and a lower limit frequency of the stop band of the second resonator, and an upper limit frequency of the stop band of the shared reflector is between an upper limit frequency of the stop band of the first resonator and an upper limit frequency of the stop band of the second resonator. Therefore, in comparison with the case where the electrode finger pitch of the shared reflector is made equal to the electrode finger pitch of any one of the resonators, a stop band in the filter device is expanded, with the result that the deterioration of the filter characteristics is suppressed.

The "stop band" in the first preferred embodiment represents a frequency range having a reflection coefficient higher than about 70% of the peak value of the reflection coefficient, for example. In the first preferred embodiment, the lower limit frequency of the stop band corresponds to the resonant frequency of each resonator. The upper limit frequency of the stop band corresponds to the frequency at which a stop band ripple begins to appear (regions RG10, RG11 in FIGS. 5A and 5B) in the impedance characteristics of each resonator.

Next, a configuration for reducing the influence of higher-order mode spurious responses will be described in more detail with reference to FIG. 6 to FIG. 9.

Figure 6:
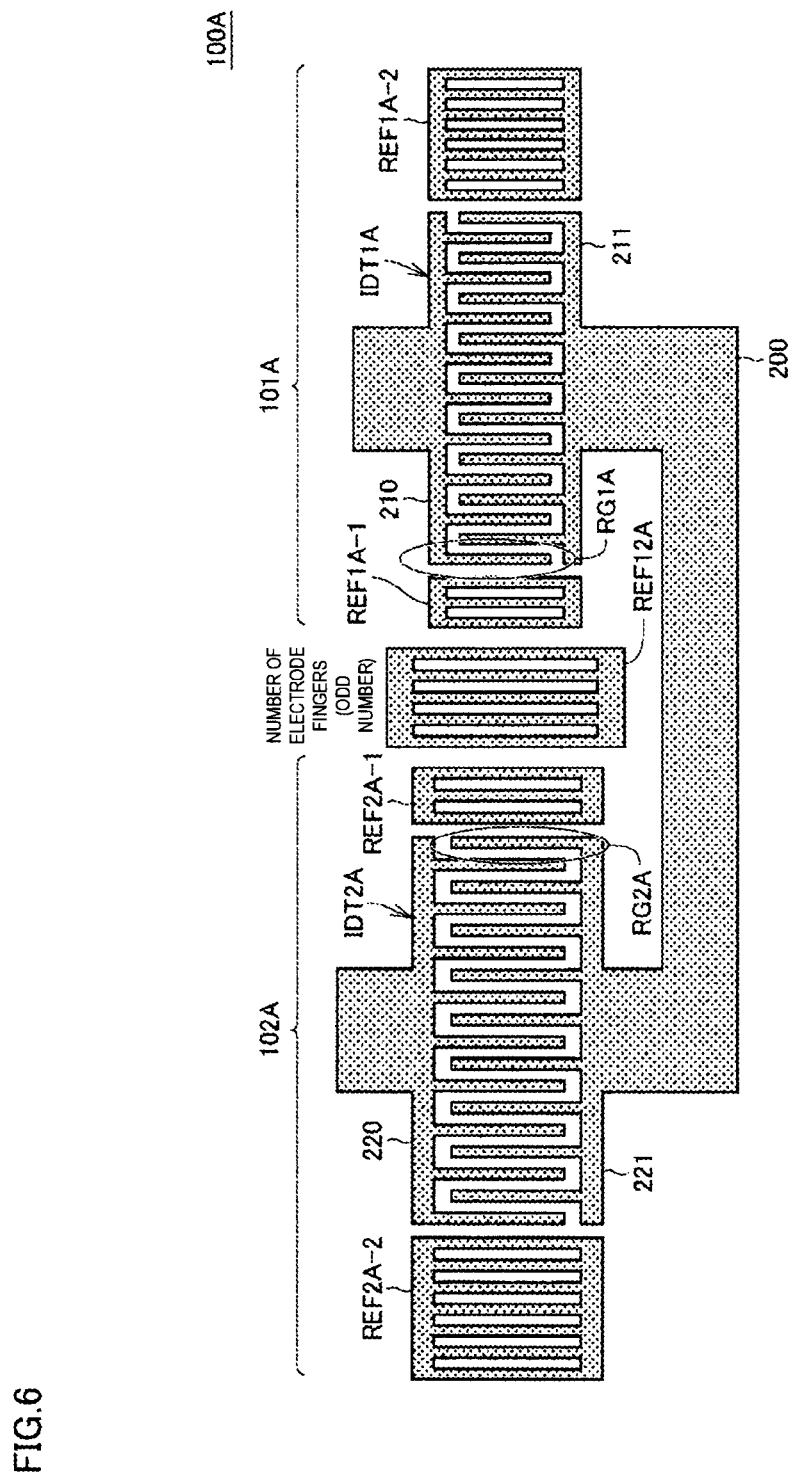
FIG. 6 is a top view of an acoustic wave device in the case where the number of electrode fingers of a shared reflector is odd.
Figure 7:
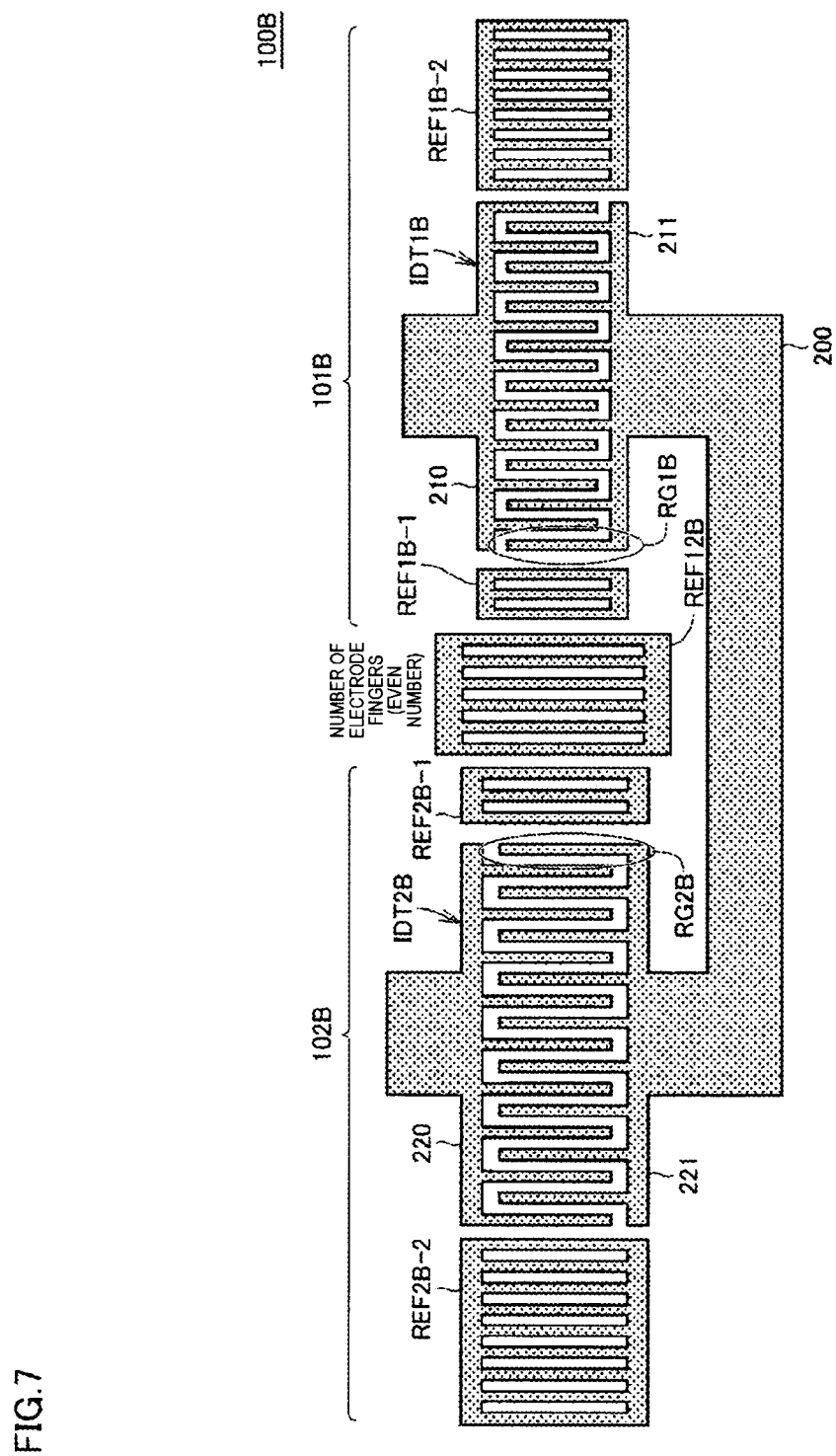
FIG. 7 is a top view of an acoustic wave device in the case where the number of electrode fingers of a shared reflector is even.

FIG. 6 and FIG. 7 are top views of acoustic wave devices according to the first preferred embodiment. FIG. 6 is a top view of the acoustic wave device 100A in the case where the number of electrode fingers of the shared reflector is odd. FIG. 7 is a top view of the acoustic wave device 100B in the case where the number of electrode fingers of the shared reflector is even. In FIG. 6 and FIG. 7, the adjacent two acoustic wave resonators may be series arm resonators or may be parallel arm resonators. Alternatively, one of the two acoustic wave resonators may be a series arm resonator, and the other one may be a parallel arm resonator.

As shown in FIG. 6, the acoustic wave device 100A includes acoustic wave resonators 101A, 102A, and a shared reflector REF12A disposed between the acoustic wave resonators 101A, 102A. In the acoustic wave device 100A, a busbar 211 of an interdigital transducer electrode IDT1A in the acoustic wave resonator 101A and a busbar 221 of an interdigital transducer electrode IDT2A in the acoustic wave resonator 102A are connected by a wiring pattern 200. In other words, the busbar 211 and the busbar 221 have the same potential.

In the acoustic wave device 100A, the pitch, duty, and electrode film thickness of the electrode fingers all are the same among the acoustic wave resonators 101A, 102A and the shared reflector REF12A. Therefore, the frequency band of a main mode signal and the frequency band of a higher-order mode signal of the acoustic wave resonator 101A coincide with the frequency band of a main mode signal and the frequency band of a higher-order mode signal of the acoustic wave resonator 102A.

The shared reflector REF12A is disposed between a reflector REF1A-1 of the acoustic wave resonator 101A and a reflector REF2A-1 of the acoustic wave resonator 102A. The sum of the number of the electrode fingers of the reflector REF1A-1 and the number of the electrode fingers of the shared reflector REF12A is the same as the number of the electrode fingers of the reflector REF1A-2. The sum of the number of the electrode fingers of the reflector REF2A-1 and the number of the electrode fingers of the shared reflector REF12A is the same as the number of the electrode fingers of the reflector REF2A-2. As described above, the number of the electrode fingers of the shared reflector REF12A is odd. The number of the electrode fingers of the reflector REF1A-1 of the acoustic wave resonator 101A is set so as to be equal to the number of the electrode fingers of the reflector REF2A-1 of the acoustic wave resonator 102A.

In the interdigital transducer electrode IDT1A of the acoustic wave resonator 101A, the electrode finger closest to the acoustic wave resonator 102A (the electrode finger in a region RG1A), that is, the electrode finger facing the reflector REF1A-1, is connected to the busbar 210. In the interdigital transducer electrode IDT2A of the acoustic wave resonator 102A, the electrode finger closest to the acoustic wave resonator 101A (the electrode finger in a region RG2A), that is, the electrode finger facing the reflector REF2A-1, is connected to the busbar 221. In other words, when the number of the electrode fingers of the shared reflector is odd, the electrode fingers respectively closest to the other acoustic wave resonators in the interdigital transducer electrodes are disposed so as to have mutually opposite potentials (reversed polarities).

On the other hand, in the acoustic wave device 100B of FIG. 7, the number of the electrode fingers of a shared reflector REF12B disposed between two acoustic wave resonators 101B, 102B is even. In the interdigital transducer electrode IDT1B of the acoustic wave resonator 101B, the electrode finger closest to the acoustic wave resonator 102B (the electrode finger in a region RG1B), that is, the electrode finger facing the reflector REF1B-1, is connected to the busbar 211. In the interdigital transducer electrode IDT2B of the acoustic wave resonator 102B, the electrode finger closest to the acoustic wave resonator 101B (the electrode finger in a region RG2B), that is, the electrode finger facing the reflector REF2B-1, is connected to the busbar 221. In other words, when the number of the electrode fingers of the shared reflector is even, the electrode fingers respectively closest to the other acoustic wave resonators in the interdigital transducer electrodes are disposed so as to have the same potential (same polarity).

Figure 8:
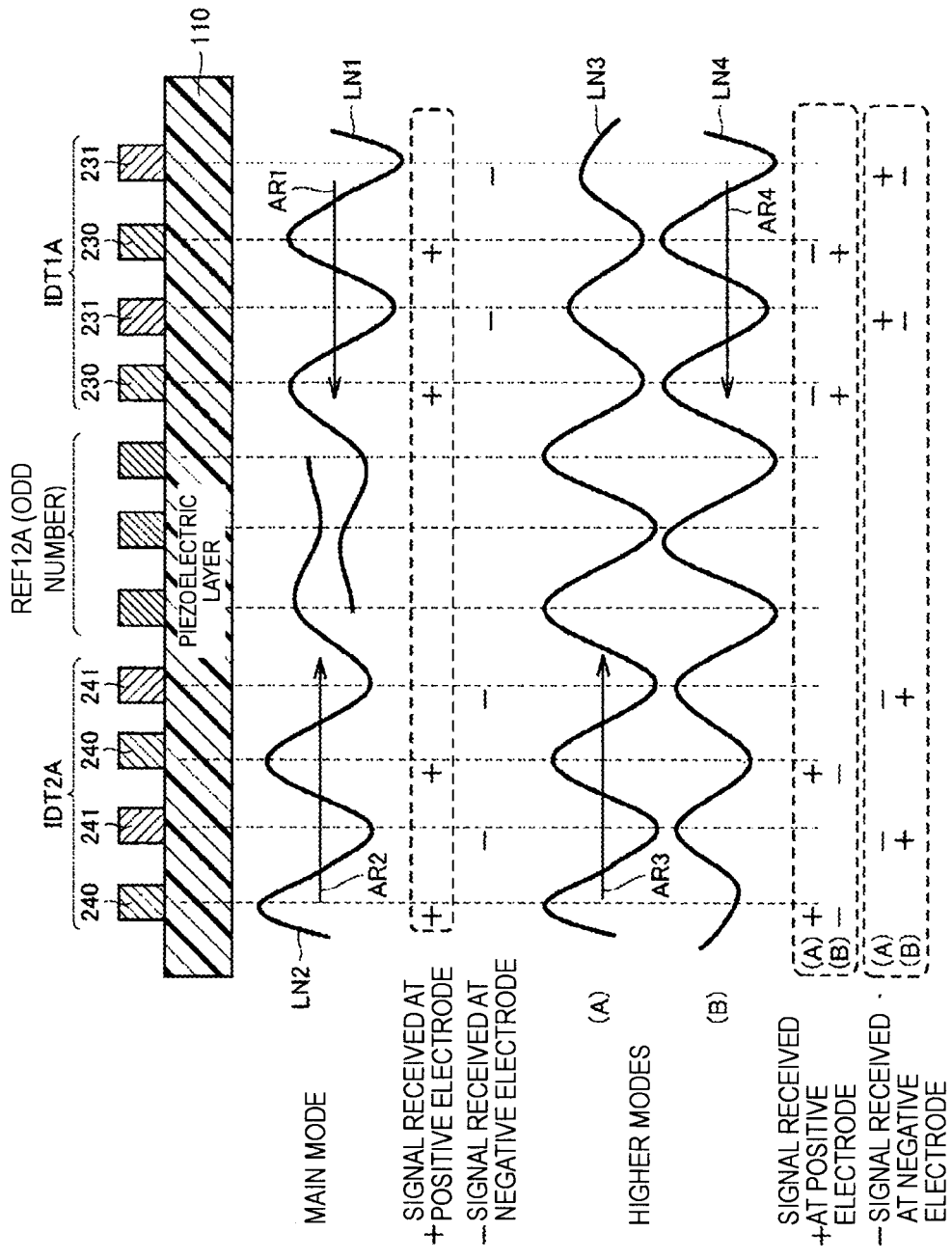
FIG. 8 is a view for illustrating the principle in which higher-order mode spurious responses are reduced.

The principle in which higher-order mode spurious responses are reduced by arrangement of the electrode fingers of the interdigital transducer electrodes as described above will be described with reference to FIG. 8. In FIG. 8, the acoustic wave device 100B in which the number of the electrode fingers of the shared reflector is odd will be described. For the sake of easy illustration, the reflectors REF1A-1, 2A-1 are omitted.

As shown in FIG. 8, in the interdigital transducer electrode IDT1A of the acoustic wave resonator 101A, the electrode fingers connected to the busbar 210 are assumed as electrode fingers 230, and the electrode fingers connected to the busbar 211 are assumed as electrode fingers 231. In the interdigital transducer electrode IDT2A of the acoustic wave resonator 102A, the electrode fingers connected to the busbar 220 are assumed as electrode fingers 240, and the electrode fingers connected to the busbar 221 are assumed as electrode fingers 241.

In the acoustic wave device 100A, it is assumed that each of the busbars 210, 220 is a positive electrode having a high potential and each of the busbars 211, 221 is a negative electrode having a low potential. As described above, the busbar 211 and the busbar 221 have the same potential since the busbar 211 and the busbar 221 are connected by the wiring pattern 200.

In the interdigital transducer electrode, the pitch of any adjacent electrode fingers is a half-wave length ($\lambda/2$) of propagating surface acoustic waves. In other words, surface acoustic waves that propagate through each interdigital transducer electrode are at a high potential in the positive electrode and are at a low potential in the negative electrode.

For a main mode signal, a signal like the line LN1 propagates in the direction of the arrow AR1 from the interdigital transducer electrode IDT1A. In addition, a signal like the line LN2 propagates in the direction of the arrow AR2 from the interdigital transducer electrode IDT2A. However, since main mode signals are reflected by the reflector disposed between the two interdigital transducer electrodes, the main mode signals do not reach the other interdigital transducer electrodes.

On the other hand, for a higher-order mode signal, a signal is not sufficiently reflected by the reflector, and at least a portion of the signal passes through the reflector to the other interdigital transducer electrode. In FIG. 8, a signal like the line LN3 propagates in the direction of the arrow AR3 from the interdigital transducer electrode IDT2A. Since the number of the electrode fingers of the shared reflector REF12A is odd (that is, the number of the electrode fingers between the resonators is odd), in the interdigital transducer electrode IDT1A, a low-potential signal from the interdigital transducer electrode IDT2A is received at the positive electrode (electrode fingers 230) and a high-potential signal from the interdigital transducer electrode IDT2A is received at the negative electrode (electrode fingers 231). Conversely, a higher-order mode signal that occurs in the interdigital transducer electrode IDT1A and propagates is at a high potential at the positive electrode (electrode fingers 230) and is at a low potential at the negative electrode (electrode fingers 231). In other words, each of the electrode fingers receives a high potential signal from one of the resonators and a low potential signal from the other one of the resonators, so higher-order mode signals cancel out each other at each electrode finger.

When the number of the electrode fingers in the reflector between the interdigital transducer electrodes is odd, a higher-order mode signal generated in the interdigital transducer electrode IDT1A is, for example, in inverted phase at the time point at which the signal passes through the reflector. Therefore, when the potential of the electrode finger facing the reflector in the interdigital transducer electrode IDT2A has a potential opposite (reversed polarity) to the electrode finger facing the reflector in the interdigital transducer electrode IDT1A, the influence of a higher-order mode signal is removed.

When the number of the electrode fingers in the reflector between the interdigital transducer electrodes is even, the phase of a higher-order mode signal at the time when the signal passes through the reflector is in phase with a signal output from the interdigital transducer electrode. Therefore, in the acoustic wave device 100B, when the electrode finger facing the reflector in the interdigital transducer electrode IDT2B has the same potential (same polarity) as the electrode finger facing the reflector in the interdigital transducer electrode IDT1B, the influence of higher-order mode signals is removed.

In the first preferred embodiment, as described above, since the number of the electrode fingers of the reflector disposed between the interdigital transducer electrode and the shared reflector is designed to be the same number, whether the number of the electrode fingers of the reflector between the interdigital transducer electrodes is even or odd number depends on the electrode fingers of the shared reflector.

The above-described example assumes the case where the main mode frequencies in the two acoustic wave resonators coincide with each other (that is, higher-order mode frequencies also coincide with each other) has been described; however, in an actual design, the frequencies of higher-order modes of adjacent acoustic wave resonators do not always completely coincide with each other. Hereinafter, a frequency difference between acoustic wave resonators, with which the influence of higher-order mode spurious responses is removable, will be described.

As described above, to remove the influence of higher-order modes, a higher-order mode signal propagated from one of the acoustic wave resonators needs to be in opposite phase with a higher-order mode signal in the other one of the acoustic wave resonators. From the relationship among acoustic velocity v, frequency f, and wave length λ (v=fλ), when the acoustic velocity is constant, a frequency difference is expressed as a difference in wave length. In the case of an SAW resonator including an interdigital transducer electrode, the pitch of electrode fingers is set to one half of a wave length (λ/2) of propagating surface acoustic waves. Therefore, when there is a pitch difference (that is, a frequency difference) between the electrode fingers of the two acoustic wave resonators, a propagation distance in the shared reflector extends, and, as the number of electrode fingers to propagate increases, a phase difference between two signals expands at the time of reaching the other interdigital transducer electrode. When the phase difference is less than or equal to λ/4, it is expected to remove the influence of higher-order modes.

Figure 9:
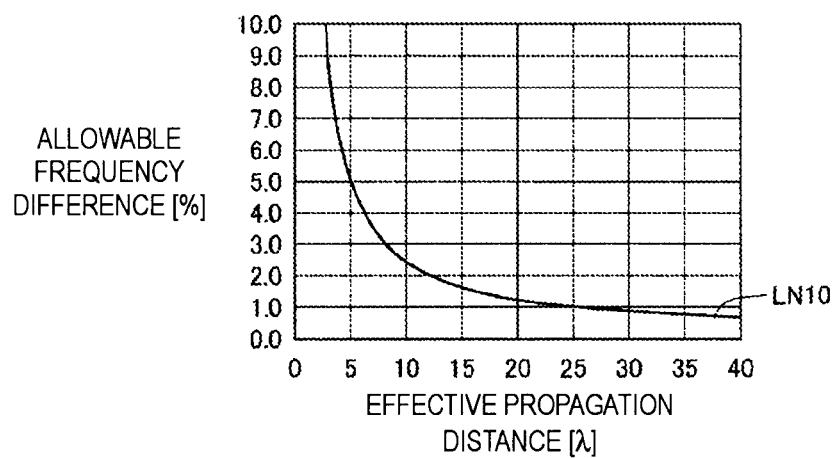
FIG. 9 is a graph for illustrating the relationship between the effective propagation distance of a signal and an allowable frequency difference.

FIG. 9 is a graph showing the relationship between the effective propagation distance of a signal and an allowable frequency difference between two acoustic wave resonators. Here, the "effective propagation distance" is a critical distance with which a phase difference between signals that respectively propagate through two acoustic wave resonators is able to be less than or equal to λ/4 and is expressed by using the wave length (λ). As shown by the line LN10 of FIG. 9, when, for example, the effective propagation distance is 10λ (that is, the number of electrode fingers in the shared reflector is 20), it is clear that the influence of higher-order modes is able to be removed when the frequency difference between the two acoustic wave resonators is less than or equal to about 2.5%. As described above, as the propagation distance of surface acoustic waves in the shared reflector extends (that is, as the number of electrode fingers increases), the pitch difference of electrode fingers is integrated, so the phase difference between two signals at the time of reaching the other interdigital transducer electrodes expands. Therefore, as the propagation distance in the shared reflector extends, an allowable frequency difference reduces, and it is necessary to increase the degree of coincidence between the frequencies of the two acoustic wave resonators.

When the length in wave length is referred to as "wave length conversion length (N)", an allowable frequency difference is expressed as the following mathematical expression (1), and this corresponds to the line LN10 of FIG. 9.

$$\text{(Allowable Frequency Difference) [\%]}=25/N \qquad (1)$$

Here, where the number of the electrode fingers of the shared reflector is n, the relationship between the wave length conversion length N and the number n of the electrode fingers is expressed by n=2N, so the mathematical expression (2) is derived from the relationship and the mathematical expression (1).

$$\text{(Allowable Frequency Difference) [\%]}=50/n \qquad (2)$$

In the present disclosure, the phrase "higher-order mode frequencies coincide each other" means that the allowable frequency difference falls within the range from 0% to (50/n) %.

From the viewpoint of size reduction, it is preferable to increase the number of shared electrode fingers; however, as the number of shared electrode fingers increases, it is necessary to increase the degree of coincidence of frequency between resonators. Therefore, the size of the shared reflector is selected as needed according to a frequency difference between two resonators and the overall size of an acoustic wave device.

Modification

In the acoustic wave device of the first preferred embodiment, the configuration in which the electrode fingers in each of the interdigital transducer electrode and the reflectors extend in the direction orthogonal to the busbars connected to the electrode fingers has been described. In an acoustic wave device of a modification, a configuration in which the electrode fingers of each of an interdigital transducer electrode and reflectors are disposed obliquely with respect to busbars will be described.

Figure 10:
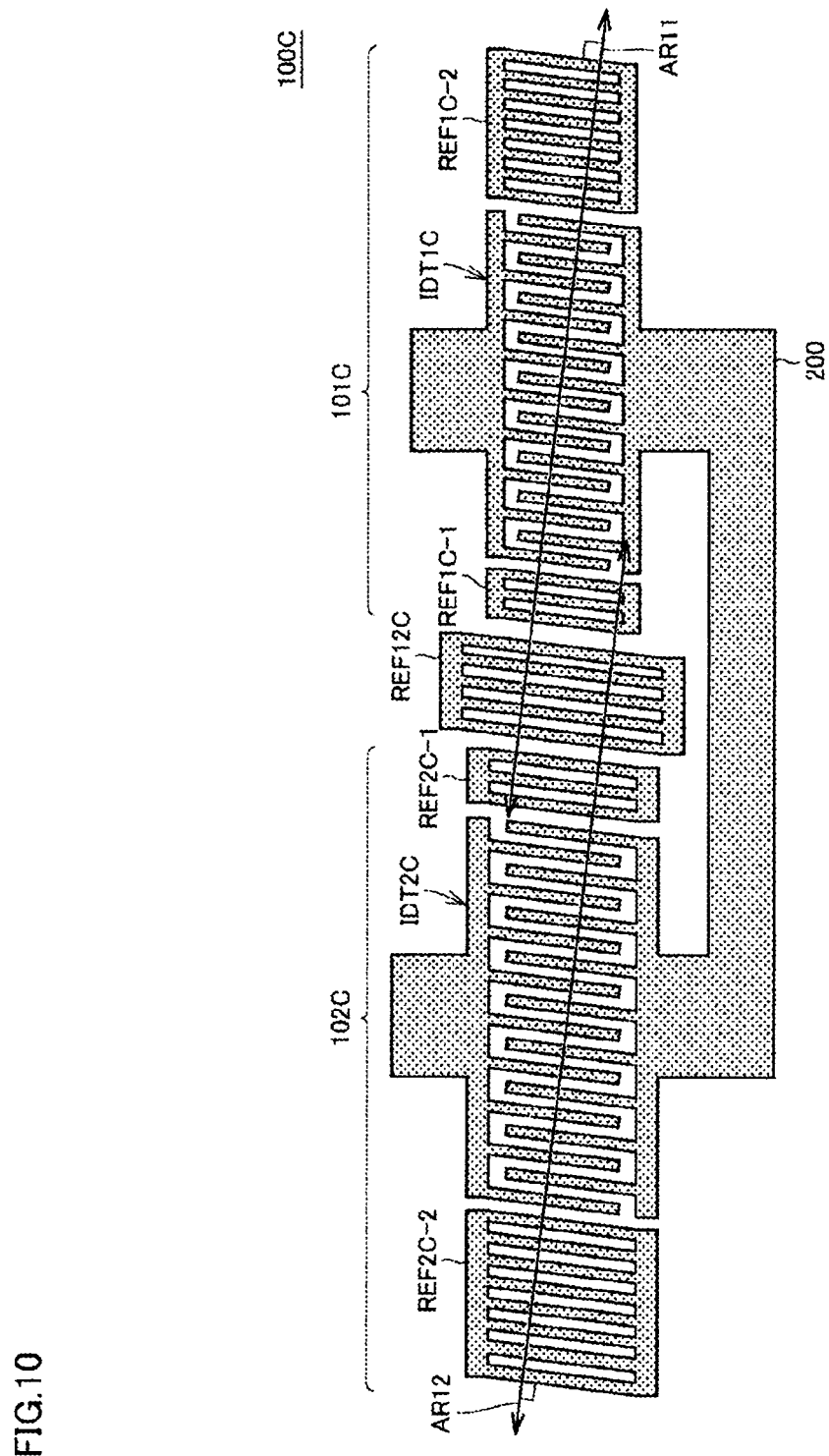
FIG. 10 is a top view of an acoustic wave device of a modification of a preferred embodiment of the present invention.

FIG. 10 is a top view of an acoustic wave device 100C according to the modification. The acoustic wave device 100C includes acoustic wave resonators 101C, 102C, and a shared reflector REF12C disposed between the acoustic wave resonators 101C, 102C.

The acoustic wave resonator 101C includes an interdigital transducer electrode IDT1C, and reflectors REF1C-1, REF1C-2 disposed on both sides of the interdigital transducer electrode IDT1C. The acoustic wave resonator 102C includes an interdigital transducer electrode IDT2C, and reflectors REF2C-1, REF2C-2 disposed on both sides of the interdigital transducer electrode IDT2C.

The shared reflector REF12C is disposed between the reflector REF1C-1 and the reflector REF2C-1. The sum of the number of the electrode fingers of the reflector REF1C-1 and the number of the electrode fingers of the shared reflector REF12C is the same as the number of the electrode fingers of the reflector REF1C-2. The sum of the number of the electrode fingers of the reflector REF2C-1 and the number of the electrode fingers of the shared reflector REF12C is the same as the number of the electrode fingers of the reflector REF2C-2. In the acoustic wave device 100C, the electrode fingers of each of the acoustic wave resonators 101C, 102C and the shared reflector REF12C are connected obliquely to the busbars. An angle formed between the electrode fingers and the busbar is larger than 0° and smaller than 90°.

In the acoustic wave resonator, surface acoustic waves propagate in a direction orthogonal to the electrode fingers. For example, in the acoustic wave device 100C, a signal from the acoustic wave resonator 101C propagates in the direction of the arrow AR11 of FIG. 10, and a signal from the acoustic wave resonator 102C propagates in the direction of the arrow AR12 of FIG. 10. As in the case of the acoustic wave device 100C of the modification, by disposing the electrode fingers so as to incline with respect to the busbars for adjacent acoustic wave resonators, the propagation direction of surface acoustic waves in one of the acoustic wave resonators is able to be outside the overlap width region of the electrode fingers in the interdigital transducer electrode of the other one of the acoustic wave resonators. Therefore, the influence of surface acoustic waves having leaked from the shared reflector on the other one of the acoustic wave resonators is further reduced.

The acoustic wave device 100C of FIG. 10 corresponds to the configuration in which the electrode fingers of the acoustic wave device 100A of FIG. 6, in which the number of electrode fingers of the shared reflector is odd, are disposed so as to be inclined. For the acoustic wave device 100B of FIG. 7 in which the number of electrode fingers of the shared reflector is even, the electrode fingers may be disposed so as to be inclined.

Second Preferred Embodiment

In the first preferred embodiment, the case where main mode frequencies in adjacent two acoustic wave resonators coincide with each other has been described. However, in an actual design, there is a case where main mode frequencies of adjacent acoustic wave resonators are different from each other. In this case, when the shared reflector is used, higher-order mode spurious responses are possibly not able to be removed only by adjusting the polarities of the electrode fingers of the interdigital transducer electrodes according to the number of the electrode fingers in the shared reflector.

In a second preferred embodiment, a configuration in which, when main mode frequencies of adjacent acoustic wave resonators are different from each other, the influence of higher-order mode spurious responses is reduced by adjusting the frequencies of the higher-order mode spurious responses while maintaining the main mode frequencies will be described.

Generally, in a resonator, frequency dependence in the structural parameters of the resonator, such as wave length, piezoelectric layer film thickness, electrode film thickness, and duty is different between a main mode and a higher-order mode. For this reason, by using such characteristics, the frequency of a higher-order mode is shifted while the frequency of a main mode is maintained.

FIG. 11 is a table showing a frequency sensitivity ratio of a higher-order mode to the structural parameters (wave length, piezoelectric layer film thickness, electrode film thickness, and duty) of a resonator. A frequency sensitivity ratio represents a rate of change in the frequency of the higher-order mode when a rate of change in the resonant frequency of the main mode is 1.00. The sign of the frequency sensitivity ratio is expressed as a positive value when the resonant frequency of the main mode and/or the frequency of the higher-order mode increases with an increase in the structural parameters of the resonator, and is expressed as a negative value when the resonant frequency of the main mode and/or the frequency of the higher-order mode reduces. When the absolute value of the frequency sensitivity ratio is greater than 1.00, it indicates that a rate of change in the frequency of the higher-order mode in the case where the structural parameters are changed is greater than a rate of change in the frequency of the main mode.

In the film thickness of a piezoelectric layer, the tendency of dependence of the resonant frequency of the main mode and the frequency of the higher-order mode on the structural parameters of a resonator changes according to the material and thickness of the piezoelectric layer. When the piezoelectric layer is LT or LN and the thickness is less than or equal to 2λ with respect to the wave length λ determined by an electrode finger pitch, a frequency sensitivity ratio is as follows. In other words, when the main mode is, for example, A0 mode (zero-order anti-symmetric mode) or SH0 mode (zero-order shear horizontal mode), the sign of the frequency sensitivity ratio is positive. On the other hand, when the main mode is, for example, S0 mode (symmetric mode), SH1 mode (primary shear horizontal mode), A1 mode (primary anti-symmetric mode), and a higher-order vibration mode higher than or equal to these modes, the sign of the frequency sensitivity ratio is negative. When the higher-order mode is, for example, A0 mode or SH0 mode, the sign of the frequency sensitivity ratio is positive. When the higher-order mode is, for example, S0 mode, SH1 mode, A1 mode, or a higher-order vibration mode higher than or equal to these modes, the sign of the frequency sensitivity ratio is negative. In a higher-order mode, the absolute value of the frequency sensitivity ratio also changes according to the vibration mode. On the other hand, when the thickness of the piezoelectric layer falls within the range of 2λ to 5λ, the above-described dependence tendency disappears.

FIG. 11 is a table showing a frequency sensitivity ratio in the case where SH0 mode is used as the main mode and S0 mode is used as the higher-order mode. In a first example to a fourth example (described later) as well, the case where these modes are used is described.

As shown in FIG. 11, when, for example, the wave length (that is, the electrode finger pitch) is changed, a rate of change in the frequency of the higher-order mode is −0.67 for a rate of change −1.00 in the resonant frequency of the main mode. In other words, when the wave length is changed, a frequency change in the higher-order mode is smaller than a frequency change in the main mode.

The frequency sensitivity ratio of the higher-order mode in the case where the piezoelectric layer film thickness is changed is −2.40. In this case, as the resonant frequency of the main mode increases, the frequency of the higher-order mode decreases with a higher degree than the main mode. Similarly, the frequency sensitivity ratio of the higher-order mode in the case where the duty of the electrode fingers is changed is 0.55, and the frequency sensitivity ratio of the higher-order mode in the case where the film thickness of the electrode fingers is changed is 0.70. In other words, when the duty and the film thickness of the electrode fingers are changed, a rate of change in frequency is smaller in the higher-order mode than in the main mode.

As shown in FIG. 11, the frequency sensitivity ratio of the higher-order mode varies in characteristics depending on the structural parameter. Therefore, when the resonant frequency of the main mode is changed by the structural parameter other than the wave length (electrode finger pitch) and then the resonant frequency of the main mode is returned by adjusting the wave length, the frequency of the higher-order mode is able to be set to a different frequency while the resonant frequency of the main mode remains unchanged.

Hereinafter, an example in which the piezoelectric layer film thickness is changed will be described in the first example, an example in which the duty of the electrode fingers is changed will be described in the second example, and an example in which the film thickness of the electrode fingers will be described in the third example.

FIRST EXAMPLE

In the first example, the case where the frequencies of higher-order mode spurious responses are adjusted by changing the film thickness of a piezoelectric layer in each of adjacent two acoustic wave resonators will be described.

Figure 12:
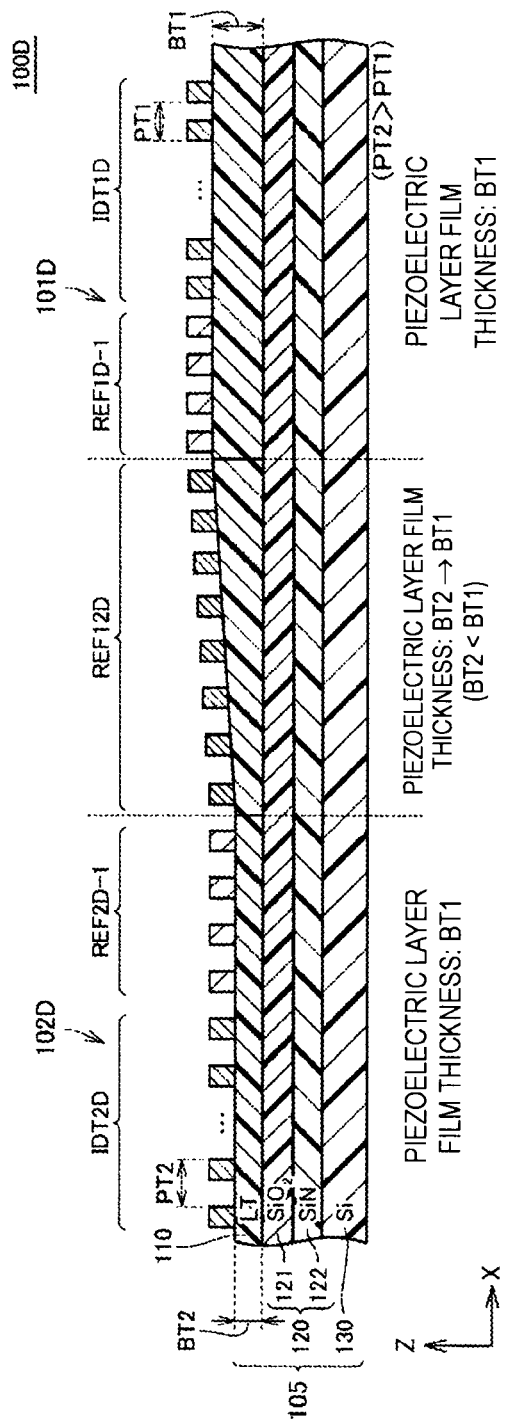
FIG. 12 is a cross-sectional view of an acoustic wave device according to a first example of a second preferred embodiment of the present invention.

FIG. 12 is a cross-sectional view of an acoustic wave device 100D according to the first example of the second preferred embodiment. As shown in FIG. 12, the acoustic wave device 100D includes acoustic wave resonators 101D, 102D, and a shared reflector REF12D disposed between the acoustic wave resonators 101D, 102D.

In the first example, the frequency of the main mode of the acoustic wave resonator 101D is set so as to be higher than the frequency of the main mode of the acoustic wave resonator 102D. In other words, the electrode finger pitch (PT1) of each of an interdigital transducer electrode IDT1D and reflectors REF1D in the acoustic wave resonator 101D is narrower than the electrode finger pitch (PT2) of each of an interdigital transducer electrode IDT2D and reflectors REF2D in the acoustic wave resonator 102D. At least a portion of the electrode fingers of the shared reflector REF12D are positioned with a pitch between the electrode finger pitch PT1 and the electrode finger pitch PT2.

In the substrate 105, the film thickness of the piezoelectric layer 110 in a region in which the acoustic wave resonator 101D is disposed is set to BT1, and the film thickness of the piezoelectric layer 110 in a region in which the acoustic wave resonator 102D is disposed is set to BT2 (BT1>BT2). The piezoelectric layer 110 of at least a portion of a region in which the shared reflector REF12D is disposed is set so as to be thinner than the film thickness BT1 of the piezoelectric layer 110 in the region in which the acoustic wave resonator 101D is disposed and thicker than the film thickness BT2 of the piezoelectric layer 110 in the region in which the acoustic wave resonator 102D is disposed. In FIG. 12, the film thickness of the electrode fingers in the shared reflector REF12D gradually reduces from the acoustic wave resonator 101D toward the acoustic wave resonator 102D.

Figure 13:
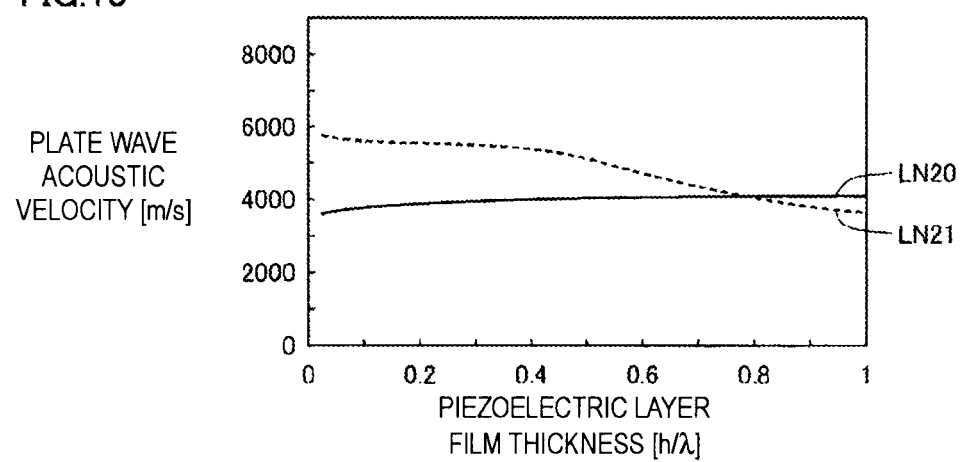
FIG. 13 is a graph for illustrating the relationship between a piezoelectric layer film thickness and a plate wave acoustic velocity in a main mode and a higher-order mode.

FIG. 13 is a graph showing the relationship between a piezoelectric layer film thickness and a plate wave acoustic velocity in a main mode and a higher-order mode. In FIG. 13, the abscissa axis represents the film thickness (h/λ) of the piezoelectric layer 110, normalized by wave length, and the ordinate axis represents plate wave acoustic velocity. In FIG. 13, the continuous line LN20 represents the case of the main mode, and the dashed line LN21 represents the case of an example of the higher-order mode.

As shown in FIG. 13, for the main mode, the plate wave acoustic velocity tends to decrease as the film thickness of the piezoelectric layer reduces, and the acoustic velocity tends to be substantially constant when the film thickness of the piezoelectric layer is thicker than a predetermined thickness. From the relationship v=fλ, even when the wave length λ (that is, the electrode finger pitch) is constant, the frequency f changes as the acoustic velocity v changes. In other words, the frequency increases as the piezoelectric layer film thickness increases, and the frequency decreases as the piezoelectric layer film thickness reduces. On the other hand, for the higher-order mode, different from the main mode, the acoustic velocity (frequency) tends to increase as the film thickness of the piezoelectric layer reduces, and the acoustic velocity (frequency) tends to decrease as the film thickness of the piezoelectric layer increases.

As shown in FIG. 11 and FIG. 13, a degree of change in frequency to the film thickness of the piezoelectric layer (the absolute value of the frequency sensitivity ratio) is greater in the higher-order mode than in the main mode, and the direction of change (the sign of the frequency sensitivity ratio) is opposite. Therefore, when the resonant frequency of the main mode is decreased by reducing the film thickness of the piezoelectric layer and then the resonant frequency of the main mode is returned to the original frequency by adjusting the electrode finger pitch, the frequency of the higher-order mode is able to be increased while the frequency of the main mode is maintained.

In the case of the acoustic wave device 100D of FIG. 12, by increasing the film thickness of the piezoelectric layer 110 on which the acoustic wave resonator 101D is disposed as compared to the film thickness of the piezoelectric layer 110 on which the acoustic wave resonator 102D is disposed, the frequency of the higher-order mode in the acoustic wave resonator 101D is decreased to be brought close to the frequency of the higher-order mode of the acoustic wave resonator 102D. Alternatively, conversely, by reducing the film thickness of the piezoelectric layer 110 on which the acoustic wave resonator 102D is disposed as compared to the film thickness of the piezoelectric layer 110 on which the acoustic wave resonator 101D is disposed, the frequency of the higher-order mode in the acoustic wave resonator 102D is increased to be brought close to the frequency of the higher-order mode of the acoustic wave resonator 101D. The frequency of the main mode can slightly change by changing the film thickness of the piezoelectric layer 110. In this case, the frequency of the main mode is able to be adjusted to a desired frequency by correcting the pitch of the intended acoustic wave resonator.

In this way, in an acoustic wave device, when the frequencies of the main modes of two acoustic wave resonators disposed adjacent to each other via a shared reflector are different from each other, the frequencies of signals of the higher-order modes are able to be brought into coincidence with each other by adjusting the film thickness of the piezoelectric layer on which each of the acoustic wave resonators is disposed, and the electrode finger pitch. By changing the polarities of the electrode fingers respectively disposed closest to the shared reflector in the interdigital transducer electrodes according to whether the number of the electrode fingers of the shared reflector is odd or even number, the influence of higher-order mode spurious responses is reduced even when the frequencies of the main modes are different from each other.

In the shared reflector REF12D, the overall electrode fingers may be positioned with an intermediate pitch, or the pitch may be configured to be gradually changed from the acoustic wave resonator 101D toward the acoustic wave resonator 102D. Alternatively, the pitch may be configured to be changed in a stepwise manner from the acoustic wave resonator 101D toward the acoustic wave resonator 102D.

The film thickness of the piezoelectric layer 110 in the region in which the shared reflector REF12D is disposed may be entirely an intermediate film thickness, and the film thickness of the piezoelectric layer 110 may be configured to be gradually changed from the acoustic wave resonator 101D toward the acoustic wave resonator 102D as shown in FIG. 12. Alternatively, the film thickness of the piezoelectric layer 110 may be configured to be changed in a stepwise manner from the acoustic wave resonator 101D toward the acoustic wave resonator 102D. However, for the pitch of the electrode fingers and the film thickness of the piezoelectric layer 110, as described with reference to FIG. 13, the piezoelectric layer film thickness (h/λ) normalized by wave length is preferably set to a substantially constant thickness.

FIGS. 14A and 14B show tables respectively showing the specific specifications of an example of the first example and its comparative example. In FIGS. 14A and 14B, the comparative example is shown at the top (FIG. 14A), and the example is shown at the bottom (FIG. 14B). In the example of FIGS. 14A and 14B, the duty of the electrode fingers is 0.5 in any of the comparative example and the example.

In the comparative example, the piezoelectric layer film thickness of each of the resonator 1 and the resonator 2 is set to 600 nm. In the comparative example, the frequency of the main mode of the resonator 1 is 2464.282 MHz, and the frequency of the higher-order mode is 3106.941 MHz. The frequency of the main mode of the resonator 2 is 2361.513 MHz, and the frequency of the higher-order mode is 3019.257 MHz.

On the other hand, in the example, the piezoelectric layer film thickness of the resonator 2 is changed to 500 nm, and the wave length is adjusted to 1.607 μm. In other words, the resonant frequency of the main mode is decreased by reducing the piezoelectric layer film thickness of the resonator 2, and the resonant frequency of the main mode is returned to the original frequency by adjusting the wave length to a shorter wave length. Thus, in the example, the frequency of the main mode of the resonator 2 is 2361.312 MHz, and the frequency of the higher-order mode of the resonator 2 is 3017.580 MHz and high. Therefore, for the resonator 2, the frequency of the higher-order mode is able to be brought into coincidence with that of the resonator 1 while the frequency of the main mode is maintained. In this way, even when the frequencies of the main modes are different from each other, the influence of higher-order mode spurious responses is able to be removed by adjusting the piezoelectric layer film thickness.

SECOND EXAMPLE

In the second example, the case where the frequencies of higher-order mode spurious responses are adjusted by changing the duty of the electrode fingers in each of adjacent two acoustic wave resonators will be described.

Figure 15:
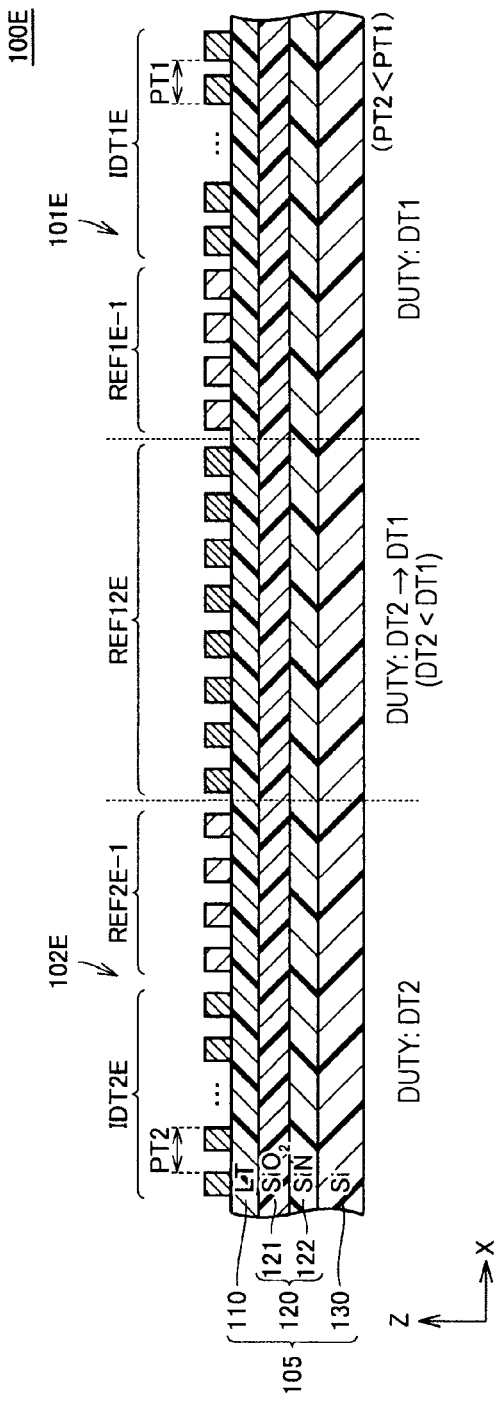
FIG. 15 is a cross-sectional view of an acoustic wave device according to a second example of the second preferred embodiment of the present invention.

FIG. 15 is a cross-sectional view of an acoustic wave device 100E according to the second example of the second preferred embodiment. As shown in FIG. 15, the acoustic wave device 100E includes acoustic wave resonators 101E, 102E, and a shared reflector REF12E disposed between the acoustic wave resonators 101E, 102E.

In the second example, the frequency of the main mode of the acoustic wave resonator 101E is set so as to be lower than the frequency of the main mode of the acoustic wave resonator 102E. In other words, the electrode finger pitch (PT1) of each of an interdigital transducer electrode IDT1E and reflectors REF1E in the acoustic wave resonator 101E is wider than the electrode finger pitch (PT2) of each of an interdigital transducer electrode IDT2E and reflectors REF2E in the acoustic wave resonator 102E. At least a portion of the electrode fingers of the shared reflector REF12E are positioned with a pitch between the electrode finger pitch PT1 and the electrode finger pitch PT2.

In the shared reflector REF12E, the overall electrode fingers may be positioned with an intermediate pitch, or the pitch may be configured to be gradually changed from the acoustic wave resonator 101E toward the acoustic wave resonator 102E. Alternatively, the pitch may be configured to be changed in a stepwise manner from the acoustic wave resonator 101E toward the acoustic wave resonator 102E.

In the acoustic wave device 100E, the duty (first duty) of the electrode fingers in the acoustic wave resonator 101E is set to DT1, and the duty (second duty) of the electrode fingers in the acoustic wave resonator 102E is set to DT2 (DT1>DT2). At least a portion of the electrode fingers in the shared reflector REF12E are formed with an intermediate duty between the first duty DT1 and the second duty DT2. In other words, at least a portion of the electrode fingers in the shared reflector REF12E are formed so as to be smaller than the first duty DT1 and larger than the second duty DT2. For example, preferably, the duty of the electrode fingers of the shared reflector REF12E is set so as to reduce gradually or in a stepwise manner from the acoustic wave resonator 101E toward the acoustic wave resonator 102E.

Figure 16:
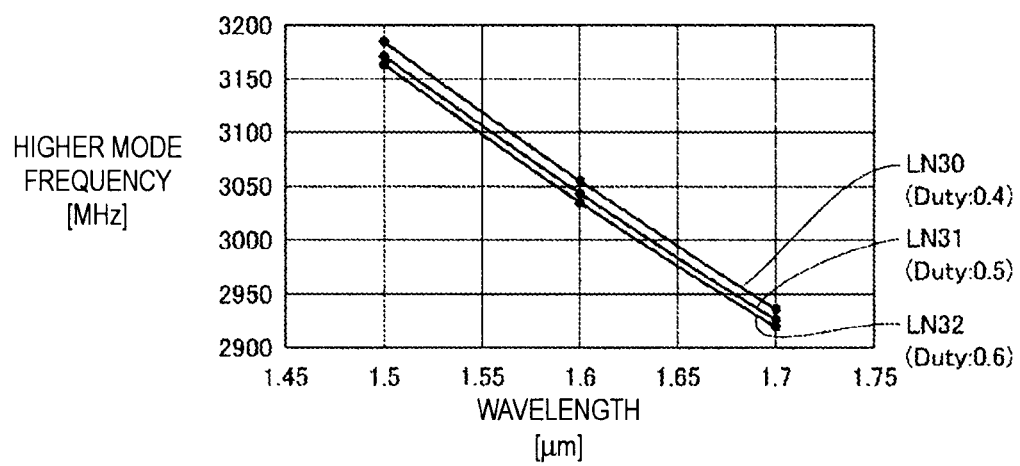
FIG. 16 is a graph for illustrating the relationship between a higher-order mode frequency and the duty of an interdigital transducer electrode.

FIG. 16 is a graph for illustrating the relationship between the frequency of a higher-order mode and the duty of the interdigital transducer electrode. In FIG. 16, the abscissa axis represents the wave length of the main mode, and the ordinate axis represents the frequency of the higher-order mode. In FIG. 16, the line LN30 represents the case where the duty of the interdigital transducer electrode is 0.4, the line LN31 represents the case where the duty of the interdigital transducer electrode is 0.5, and the line LN32 represents the case where the duty of the interdigital transducer electrode is 0.6. From these, it is clear that, even when the frequency of the main mode remains unchanged, the frequency of the higher-order mode tends to decrease as the duty increases.

The resonant frequency of the main mode is basically determined by the pitch of the electrode fingers. However, even when the electrode finger pitch remains unchanged, but when the mass of the electrode fingers increases or reduces, the resonant frequency of the main mode can change due to a mass addition effect. Specifically, the resonant frequency decreases as the mass of the electrode fingers increases, and the resonant frequency increases as the mass of the electrode fingers reduces. For this reason, when the duty is changed, the electrode width of the electrode fingers changes, and the mass increases or reduces, with the result that the resonant frequency of the main mode changes. As shown in FIG. 11, the frequency sensitivity to duty is smaller in the higher-order mode than in the main mode. Therefore, when the resonant frequency of the main mode is increased by reducing the duty of the electrode fingers and then the resonant frequency of the main mode is returned to the original frequency by adjusting the electrode finger pitch, the frequency of the higher-order mode is able to be decreased while the frequency of the main mode is maintained.

In this way, by adjusting the duty and the electrode finger pitch in each of the adjacent acoustic wave resonators, the frequencies of the higher-order modes are able to be brought into coincidence with each other by adjusting the frequencies of the higher-order modes without changing the frequencies of the main modes. Therefore, even when the frequencies of the main modes of the acoustic wave resonators are different from each other, higher-order mode spurious responses are able to be removed.

FIGS. 17A and 17B show tables respectively showing the specific specifications of an example of the second example and its comparative example. In FIGS. 17A and 17B, the comparative example is shown at the top (FIG. 17A), and the example is shown at the bottom (FIG. 17B).

In the comparative example, the duty of each of the resonator 1 and the resonator 2 is set to 0.5. In the comparative example, the frequency of the main mode of the resonator 1 is 2464.282 MHz, and the frequency of the higher-order mode is 3106.941 MHz. The frequency of the main mode of the resonator 2 is 2469.837 MHz, and the frequency of the higher-order mode is 3111.626 MHz.

On the other hand, in the example, the duty of the resonator 2 is set to 0.4, and the wave length is set to 1.559226 μm. In the shared reflector, the duty of the electrode fingers is gradually changed from 0.5 to 0.4 from the resonator 1 toward the resonator 2. In other words, the resonant frequency of the main mode is increased by reducing the duty of the resonator 2, and the resonant frequency of the main mode is returned to the original frequency by adjusting the wave length to a longer wave length. Thus, in the example, the frequency of the main mode of the resonator 2 is 2469.837 MHz, and the frequency of the higher-order mode of the resonator 2 is 3106.941 MHz and low. Therefore, for the resonator 2, the frequency of the higher-order mode is able to be brought into coincidence with that of the resonator 1 while the frequency of the main mode is maintained. In this way, even when the frequencies of the main modes are different from each other, the influence of higher-order mode spurious responses is able to be removed by adjusting the duty of the electrode fingers of each of the acoustic wave resonators.

THIRD EXAMPLE

In the third example, the case where the frequencies of higher-order mode spurious responses are adjusted by changing the film thickness of the electrode fingers in each of adjacent two acoustic wave resonators will be described.

Figure 18:
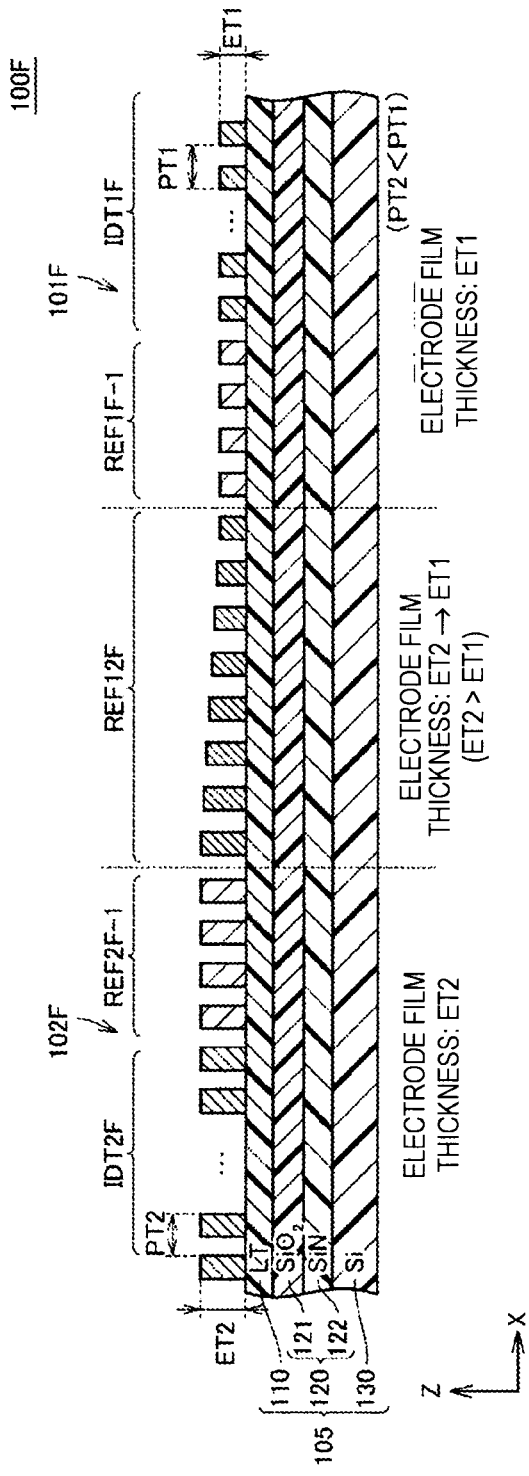
FIG. 18 is a cross-sectional view of an acoustic wave device according to a third example of the second preferred embodiment of the present invention.

FIG. 18 is a cross-sectional view of an acoustic wave device 100F according to the third example of the second preferred embodiment. As shown in FIG. 18, the acoustic wave device 100F includes acoustic wave resonators 101F, 102F, and a shared reflector REF12F disposed between the acoustic wave resonators 101F, 102F.

In the third example, the frequency of the main mode of the acoustic wave resonator 101F is set so as to be lower than the frequency of the main mode of the acoustic wave resonator 102F. In other words, the electrode finger pitch (PT1) of each of an interdigital transducer electrode IDT1F and reflectors REF1F in the acoustic wave resonator 101F is wider than the electrode finger pitch (PT2) of each of an interdigital transducer electrode IDT2F and reflectors REF2F in the acoustic wave resonator 102F. At least a portion of the electrode fingers of the shared reflector REF12F are positioned with a pitch between the electrode finger pitch PT1 and the electrode finger pitch PT2.

In the shared reflector REF12F, the overall electrode fingers may be positioned with an intermediate pitch, or the pitch may be configured to be gradually changed from the acoustic wave resonator 101F toward the acoustic wave resonator 102F. Alternatively, the pitch may be configured to be changed in a stepwise manner from the acoustic wave resonator 101F toward the acoustic wave resonator 102F.

In the acoustic wave device 100F, the film thickness of the electrode fingers in the acoustic wave resonator 101F is set to ET1, and the film thickness of the electrode fingers in the acoustic wave resonator 102F is set to ET2 (ET1<ET2). At least a portion of the electrode fingers in the shared reflector REF12F are formed with an intermediate film thickness between the film thickness ET1 and the film thickness ET2. In other words, at least a portion of the electrode fingers in the shared reflector REF12F are thicker than the film thickness ET1 of the electrode fingers in the acoustic wave resonator 101F and thinner than the film thickness ET2 of the electrode fingers in the acoustic wave resonator 102F. Preferably, the film thickness of the electrode fingers of the shared reflector REF12F is set so as to increase gradually or in a stepwise manner from the acoustic wave resonator 101F toward the acoustic wave resonator 102F.

Figure 19:
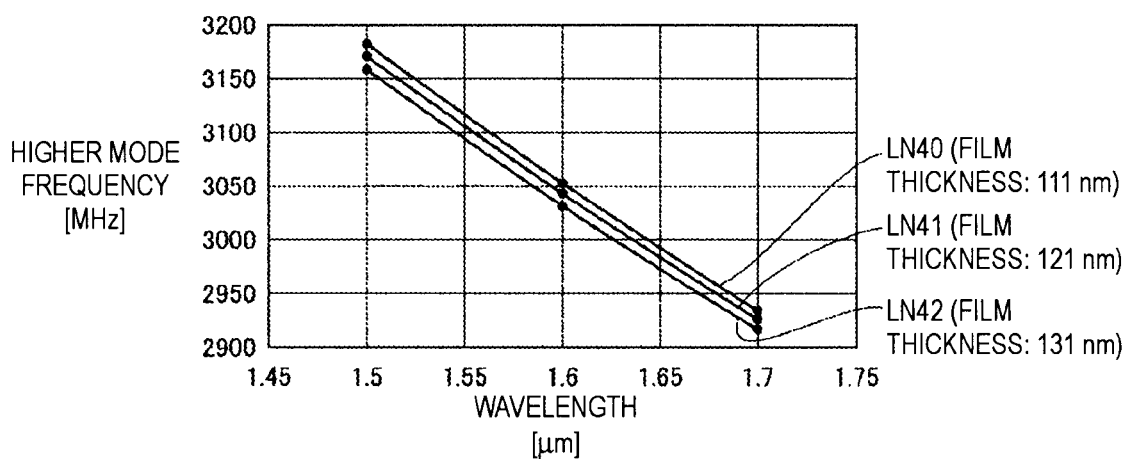
FIG. 19 is a graph for illustrating the relationship between a higher-order mode frequency and the film thickness of an interdigital transducer electrode.

FIG. 19 is a graph for illustrating the relationship between the frequency of a higher-order mode and the film thickness of an interdigital transducer electrode. In FIG. 19, the abscissa axis represents the wave length of the main mode, and the ordinate axis represents the frequency of the higher-order mode. In FIG. 19, the line LN40 represents the case where the film thickness of the interdigital transducer electrode is 111 nm, the line LN41 represents the case where the film thickness of the interdigital transducer electrode is 121 nm, and the line LN42 represents the case where the film thickness of the interdigital transducer electrode is 131 nm. From these, it is clear that, even when the frequency of the main mode remains unchanged, the frequency of the higher-order mode tends to decrease as the film thickness of the interdigital transducer electrode increases.

As in the case of the second example in which the duty is changed, the mass of the electrode increases as the film thickness of the interdigital transducer electrode is increased, so the resonant frequency of the main mode decreases due to a mass addition effect. As shown in FIG. 11, the frequency sensitivity to the film thickness of the interdigital transducer electrode is smaller in the higher-order mode than in the main mode. Therefore, when the resonant frequency of the main mode is decreased by increasing the film thickness of the interdigital transducer electrode and then the resonant frequency of the main mode is returned to the original frequency by adjusting the electrode finger pitch, the frequency of the higher-order mode is able to be decreased while the frequency of the main mode is maintained.

In this way, by adjusting the film thickness of the interdigital transducer electrode and the electrode finger pitch in each of the adjacent acoustic wave resonators, the frequencies of the higher-order modes are able to be brought into coincidence with each other by adjusting the frequencies of the higher-order modes without changing the frequencies of the main modes. Therefore, even when the frequencies of the main modes of the acoustic wave resonators are different from each other, higher-order mode spurious responses are able to be removed.

FIGS. 20A and 20B show tables respectively showing the specific specifications of an example of the third example and its comparative example. In FIGS. 20A and 20B, the comparative example is shown at the top (FIG. 20A), and the example is shown at the bottom (FIG. 20B).

In the comparative example, the electrode film thickness of each of the resonator 1 and the resonator 2 is set to 121 nm. In the comparative example, the frequency of the main mode of the resonator 1 is 2464.282 MHz, and the frequency of the higher-order mode is 3106.941 MHz. The frequency of the main mode of the resonator 2 is 2468.655 MHz, and the frequency of the higher-order mode is 3110.626 MHz.

On the other hand, in the example, the electrode film thickness of the resonator 2 is set to 191 nm, and the wave length is set to 1.48439 μm. In the shared reflector, the electrode film thickness is gradually changed from 121 nm to 191 nm from the resonator 1 toward the resonator 2. In other words, the resonant frequency of the main mode is decreased by increasing the electrode film thickness of the resonator 2, and the resonant frequency of the main mode is returned to the original frequency by adjusting the wave length to a shorter wave length. Thus, in the example, the frequency of the main mode of the resonator 2 is 2468.227 MHz, and the frequency of the higher-order mode of the resonator 2 is 3107.036 MHz and low. Therefore, for the resonator 2, the frequency of the higher-order mode is able to be brought into coincidence with that of the resonator 1 while the frequency of the main mode is maintained. In this way, even when the frequencies of the main modes are different from each other, the influence of higher-order mode spurious responses is able to be removed by adjusting the duty of the electrode fingers of each of the acoustic wave resonators.

FOURTH EXAMPLE

When a dielectric layer is disposed as a protective film in an interdigital transducer electrode, the frequency of the higher-order mode is able to be adjusted by the thickness of the dielectric layer.

Figure 21:
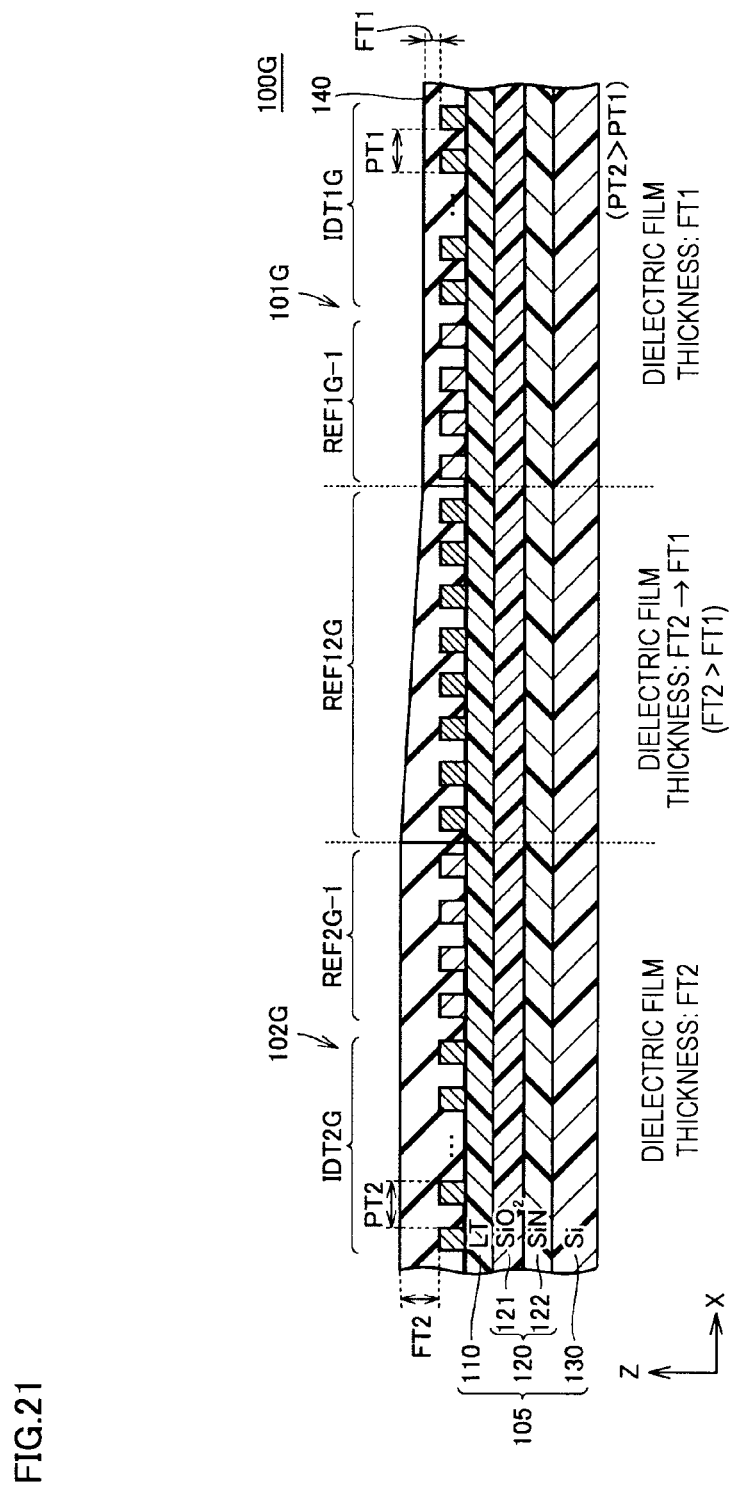
FIG. 21 is a cross-sectional view of an acoustic wave device according to a fourth example of the second preferred embodiment of the present invention.

FIG. 21 is a cross-sectional view of an acoustic wave device 100G according to the fourth example of the second preferred embodiment. As shown in FIG. 21, the acoustic wave device 100G includes acoustic wave resonators 101G, 102G, a shared reflector REF12G disposed between the acoustic wave resonators 101G, 102G, and a dielectric layer 140 that covers the interdigital transducer electrode and reflectors of each resonator.

The dielectric layer 140 is, for example, a material, such as silicon dioxide, glass, silicon oxynitride, tantalum oxide, silicon nitride, aluminum nitride, aluminum oxide (alumina), silicon oxynitride, silicon carbide, diamondlike carbon (DLC), and diamond, and may be made of a chemical compound or the like of silicon dioxide added with fluorine, carbon, boron, or the like. The dielectric layer 140 is disposed so as to cover functional elements (the interdigital transducer electrode and the reflectors) disposed on the piezoelectric layer 110 of the substrate 105.

In the fourth example, the frequency of the main mode of the acoustic wave resonator 101G is set so as to be higher than the frequency of the main mode of the acoustic wave resonator 102G. In other words, the electrode finger pitch (PT1) of each of an interdigital transducer electrode IDT1G and reflectors REF1G in the acoustic wave resonator 101G is narrower than the electrode finger pitch (PT2) of each of an interdigital transducer electrode IDT2G and reflectors REF2G in the acoustic wave resonator 102G. At least a portion of the electrode fingers of the shared reflector REF12G are positioned with a pitch between the electrode finger pitch PT1 and the electrode finger pitch PT2.

In the shared reflector REF12G, the overall electrode fingers may be positioned with an intermediate pitch, or the pitch may be configured to be gradually changed from the acoustic wave resonator 101G toward the acoustic wave resonator 102G. Alternatively, the pitch may be configured to be changed in a stepwise manner from the acoustic wave resonator 101G toward the acoustic wave resonator 102G.

In the acoustic wave device 100G, the film thickness of the dielectric layer 140 in the acoustic wave resonator 101G is set to FT1, and the film thickness of the dielectric layer 140 in the acoustic wave resonator 102G is set to FT2 (FT1<FT2). At least a portion of the dielectric layer in the shared reflector REF12G are formed with an intermediate film thickness between the film thickness FT1 and the film thickness FT2. In other words, at least a portion of the dielectric layer in the shared reflector REF12G are thicker than the film thickness FT1 of the dielectric layer in the acoustic wave resonator 101G and thinner than the film thickness FT2 of the dielectric layer in the acoustic wave resonator 102G. Preferably, the film thickness of the dielectric layer of the shared reflector REF12G is set so as to increase gradually or in a stepwise manner from the acoustic wave resonator 101G toward the acoustic wave resonator 102G.

When the dielectric layer 140 is made of a material (such as silicon dioxide, glass, tantalum oxide, niobium oxide, and tellurium oxide) having a bulk wave acoustic velocity lower than the acoustic velocity of the resonant frequency of the acoustic wave resonator 101G or the acoustic wave resonator 102G, the mass at the time of vibration of the electrode fingers increases as the dielectric layer 140 disposed on the electrode fingers thickens, so the resonant frequency and the frequency of the higher-order mode of the resonator decreases due to a mass addition effect. Therefore, as in the case of the second example and the third example, by adjusting the film thickness of the dielectric layer 140 and the pitch of the electrode fingers, the frequency of the higher-order mode is decreased while the resonant frequency of the main mode is maintained.

On the other hand, when the dielectric layer 140 is made of a material (such as glass, silicon nitride, aluminum nitride, alumina, silicon oxynitride, silicon carbide, DLC, and diamond) having a bulk wave acoustic velocity higher than the acoustic velocity of the resonant frequency of the acoustic wave resonator 101G or the acoustic wave resonator 102G, the resonant frequency of the resonator increases as the dielectric layer thickens. In this case as well, by adjusting the film thickness of the dielectric layer 140 and the pitch of the electrode fingers, the frequency of the higher-order mode is adjusted while the resonant frequency of the main mode is maintained.

In this way, even when the frequencies of the main modes of the acoustic wave resonators are different from each other, higher-order mode spurious responses are able to be removed.

Figure 22:
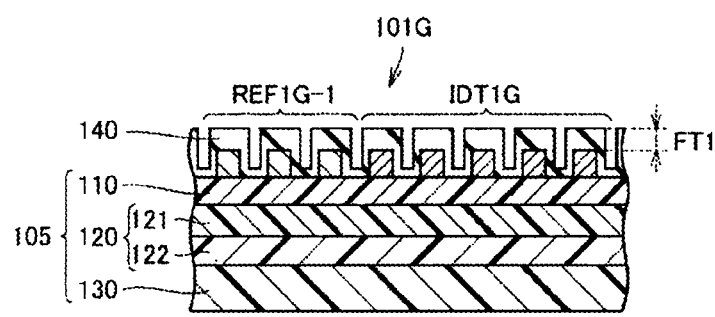
FIG. 22 is a diagram showing a modification of a dielectric layer.

In the acoustic wave device 100G shown in FIG. 21, the film thicknesses FT1, FT2 of the dielectric layer 140 each are defined as a distance from the top surface of the electrode fingers of each of the interdigital transducer electrode and the reflectors to the surface of the dielectric layer 140. In addition, as shown in FIG. 22, the dielectric layer 140 may be configured such that the position of the top surface of a dielectric at a portion where the electrode finger is provided and the position of the top surface of a dielectric at a portion where the electrode finger is not provided are different from each other.

FIFTH EXAMPLE

Generally, the resonant frequency of a resonator, the frequencies (the upper limit frequency and the lower limit frequency) of a stop band, and the frequencies (the upper limit frequency and the lower limit frequency) of a reflector exhibit a similar dependence tendency for parameters, that is, the pitch of the electrode fingers, the duty of the electrode fingers, the thickness of the electrode fingers, the thickness of the piezoelectric layer, and the thickness of the dielectric layer. As described above, for the parameters, that is, the pitch of the electrode fingers, the duty of the electrode fingers, and the thickness of the electrode fingers, the resonant frequency and the frequency of the higher-order mode of each resonator tend to decrease as the values of the parameters increase. On the other hand, for the thickness of the piezoelectric layer, when the main mode is a vibration mode, such as A0 mode and SH0 mode, the resonant frequency of each resonator increases as the value of the parameter increases. For this reason, where values obtained by multiplying the pitch of the electrode fingers, the duty of the electrode fingers, the thickness of the electrode fingers, and an inverse number of the thickness of the piezoelectric layer (=(Electrode Finger Pitch)×(Electrode Finger Duty)× (Electrode Finger Film Thickness)/(Piezoelectric Layer Film Thickness)) for the shared reflector REF12 and the two acoustic wave resonators 101, 102 are respectively a first value, a second value, and a third value, the first value of the shared reflector REF12 is set between the second value of the acoustic wave resonator 101 and the third value of the acoustic wave resonator 102. Thus, even when the frequencies of the main modes of the acoustic wave resonators are different from each other, higher-order mode spurious responses are removed.

When the main mode is a vibration mode, such as S0 mode, SH1 mode, A1 mode, and a vibration mode higher than or equal to these modes, the resonant frequency of each resonator reduces as the value of the parameter increases. For this reason, where values obtained by multiplying the pitch of the electrode fingers, the duty of the electrode fingers, the thickness of the electrode fingers, and the thickness of the piezoelectric layer (=(Electrode Finger Pitch)×(Electrode Finger Duty)×(Electrode Finger Film Thickness)×(Piezoelectric Layer Film Thickness)) for the shared reflector REF12 and the two acoustic wave resonators 101, 102 are respectively a fourth value, a fifth value, and a sixth value, the fourth value of the shared reflector REF12 is set between the fifth value of the acoustic wave resonator 101 and the sixth value of the acoustic wave resonator 102. Thus, even when the frequencies of the main modes of the acoustic wave resonators are different from each other, higher-order mode spurious responses are removed. The main mode is not limited to the vibration modes described above and may be another vibration mode.

Furthermore, when a dielectric layer that covers the acoustic wave resonator 101, the acoustic wave resonator 102, and the shared reflector REF12 and that is made of a material having a bulk wave acoustic velocity lower than the acoustic velocity of the resonant frequency of each acoustic wave resonator is provided, the resonant frequency of each resonator tends to decrease as the thickness of the dielectric layer increases. For this reason, where values obtained by multiplying the thickness of the dielectric layer by the first value, the second value, and the third value (=(Electrode Finger Pitch)×(Electrode Finger Duty)×(Electrode Finger Film Thickness)/(Piezoelectric Layer Film Thickness)×(Dielectric Layer Film Thickness)) for the shared reflector REF12 and the acoustic wave resonators 101, 102 are respectively a 1a value, a 2a value, and a 3a value, the 1a value of the shared reflector REF12 is set between the 2a value of the acoustic wave resonator 101 and the 3a value of the acoustic wave resonator 102. In addition, where values obtained by multiplying the thickness of the dielectric layer by the fourth value, the fifth value, and the sixth value (=(Electrode Finger Pitch)×(Electrode Finger Duty)×(Electrode Finger Film Thickness)×(Piezoelectric Layer Film Thickness)×(Dielectric Layer Film Thickness)) for the shared reflector REF12 and the acoustic wave resonators 101, 102 are respectively a 4a value, a 5a value, and a 6a value, the 4a value of the shared reflector REF12 is set between the 5a value of the acoustic wave resonator 101 and the 6a value of the acoustic wave resonator 102.

Alternatively, when a dielectric layer that covers the acoustic wave resonator 101, the acoustic wave resonator 102, and the shared reflector REF12 and that is made of a material having a bulk wave acoustic velocity higher than the acoustic velocity of the resonant frequency of the acoustic wave resonator is provided, the resonant frequency of each resonator tends to increase as the thickness of the dielectric layer increases. For this reason, where values obtained by multiplying an inverse number of the thickness of the dielectric layer by the first value, the second value, and the third value (=(Electrode Finger Pitch)×(Electrode Finger Duty)×Electrode Finger Film Thickness)/(Piezoelectric Layer Film Thickness)/(Dielectric Layer Film Thickness)) for the shared reflector REF12 and the acoustic wave resonators 101, 102 are respectively a 1b value, a 2b value, and a 3b value, the 1b value of the shared reflector REF12 is set between the 2b value of the acoustic wave resonator 101 and the 3b value of the acoustic wave resonator 102. In addition, where values obtained by multiplying an inverse number of the thickness of the dielectric layer by the fourth value, the fifth value, and the sixth value (=(Electrode Finger Pitch)×(Electrode Finger Duty)×(Electrode Finger Film Thickness)×(Piezoelectric Layer Film Thickness)/(Dielectric Layer Film Thickness)) for the shared reflector REF12 and the acoustic wave resonators 101, 102 are respectively a 4b value, a 5b value, and a 6b value, the 4b value of the shared reflector REF12 is set between the 5b value of the acoustic wave resonator 101 and the 6b value of the acoustic wave resonator 102.

For the relationship among the first value to the sixth value, the 1a value to the 6a value, and the 1b value to the 6b value holds, a range in which the parameters substantially linearly change needs to be used, so the conditions that the dielectric layer 140 is made of a material having a bulk acoustic velocity lower than the acoustic velocity of the resonant frequency of the acoustic wave resonator and the duty of each acoustic wave resonator is less than or equal to 0.65 are needed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
    a substrate including a piezoelectric layer;
    a first resonator on the substrate;
    a second resonator on the substrate adjacent to the first resonator and having frequency different characteristics than the first resonator; and
    a shared reflector on the substrate between the first resonator and the second resonator; wherein
    the first resonator includes a first interdigital transducer electrode including electrode fingers are positioned with a first pitch;
    the second resonator includes a second interdigital transducer electrode including electrode fingers positioned with a second pitch;
    a lower limit frequency of a stop band of the shared reflector is equal to both a lower limit frequency of a stop band of the first resonator and a lower limit frequency of a stop band of the second resonator, or between the lower limit frequency of the stop band of the first resonator and the lower limit frequency of the stop band of the second resonator;
    an upper limit frequency of the stop band of the shared reflector is equal to both an upper limit frequency of the stop band of the first resonator and an upper limit frequency of the stop band of the second resonator, or between the upper limit frequency of the stop band of the first resonator and the upper limit frequency of the stop band of the second resonator;

a higher-order mode frequency of the first resonator coincides with a higher-order mode frequency of the second resonator;

when a number of electrode fingers of the shared reflector is even, the electrode finger facing the shared reflector in the first interdigital transducer electrode has a same polarity as a polarity of the electrode finger facing the shared reflector in the second interdigital transducer electrode; and when the number of electrode fingers of the shared reflector is odd, the electrode finger facing the shared reflector in the first interdigital transducer electrode has a polarity opposite to a polarity of the electrode finger facing the shared reflector in the second interdigital transducer electrode.

2. The acoustic wave device according to claim 1, wherein the electrode fingers of the first interdigital transducer electrode are connected to a first busbar or a second busbar;

the electrode fingers of the second interdigital transducer electrode are connected to a third busbar or a fourth busbar;

the second busbar and the fourth busbar are connected;

when the number of the electrode fingers of the shared reflector is even, the electrode finger facing the shared reflector in the first interdigital transducer electrode is connected to the second busbar, and the electrode finger facing the shared reflector in the second interdigital transducer electrode is connected to the fourth busbar; and when the number of the electrode fingers of the shared reflector is odd, the electrode finger facing the shared reflector in the first interdigital transducer electrode is connected to the first busbar, and the electrode finger facing the shared reflector in the second interdigital transducer electrode is connected to the fourth busbar.

3. The acoustic wave device according to claim 1, wherein a frequency of a main mode of the first resonator is higher than a frequency of a main mode of the second resonator;

a film thickness of the piezoelectric layer in a region in which the first resonator is located is thicker than a film thickness of the piezoelectric layer in a region in which the second resonator is located; and at least a portion of the piezoelectric layer in a region in which the shared reflector is located is thinner than the film thickness of the piezoelectric layer in the region in which the first resonator is located and thicker than the film thickness of the piezoelectric layer in the region in which the second resonator is located.

4. The acoustic wave device according to claim 3, wherein the first pitch is narrower than the second pitch; and at least a portion of the electrode fingers of the shared reflector are positioned with a pitch between the first pitch and the second pitch.

5. The acoustic wave device according to claim 4, wherein the pitch of the electrode fingers of the shared reflector gradually widens from the first resonator toward the second resonator.

6. The acoustic wave device according to claim 4, wherein the pitch of the electrode fingers of the shared reflector widens in a stepwise manner from the first resonator toward the second resonator.

7. The acoustic wave device according to claim 1, wherein a frequency of a main mode of the first resonator is lower than a frequency of a main mode of the second resonator;

a film thickness of the electrode fingers of the first resonator is thinner than a film thickness of the electrode fingers of the second resonator; and a film thickness of at least a portion of the electrode fingers of the shared reflector is thicker than the film thickness of the electrode fingers of the first resonator and thinner than the film thickness of the electrode fingers of the second resonator.

8. The acoustic wave device according to claim 1, wherein a frequency of a main mode of the first resonator is lower than a frequency of a main mode of the second resonator;

a duty of the electrode fingers in the first resonator is a first duty, and a duty of the electrode fingers in the second resonator is a second duty less than the first duty; and at least a portion of the electrode fingers of the shared reflector are positioned with a duty between the first duty and the second duty.

9. The acoustic wave device according to claim 8, wherein the first pitch is wider than the second pitch; and at least portion of the electrode fingers of the shared reflector are positioned with a pitch between the first pitch and the second pitch.

10. The acoustic wave device according to claim 9, wherein the pitch of the electrode fingers of the shared reflector gradually narrows from the first resonator toward the second resonator.

11. The acoustic wave device according to claim 9, wherein the pitch of the electrode fingers of the shared reflector narrows in a stepwise manner from the first resonator toward the second resonator.

12. The acoustic wave device according to claim 1, wherein
each of the first resonator and the second resonator includes:
a first reflector between the shared reflector and the interdigital transducer electrode included in the resonator; and
a second reflector at an end portion across the interdigital transducer electrode from the first reflector;
electrode fingers of the first reflector of the first resonator are positioned with the first pitch; and
electrode fingers of the first reflector of the second resonator are positioned with the second pitch.

13. The acoustic wave device according to claim 1, wherein
each of the first and second interdigital transducer electrodes and the shared reflectors includes a busbar to which the electrode fingers are connected; and
in each of the first and second interdigital transducer electrodes and the shared reflectors, an angle between each electrode finger and the busbar is larger than 0° and smaller than 90°.

14. The acoustic wave device according to claim 1, wherein the substrate further includes a reflection layer on which the piezoelectric layer is located.

15. A ladder filter comprising the acoustic wave device according to claim 1.

16. An acoustic wave device comprising:
a substrate including a piezoelectric layer;
a first resonator on the substrate;
a second resonator on the substrate adjacent to the first resonator and having frequency different characteristics than the first resonator; and
a shared reflector on the substrate between the first resonator and the second resonator; wherein the first resonator includes a first interdigital transducer electrode including electrode fingers are positioned with a first pitch;

the second resonator includes a second interdigital transducer electrode including electrode fingers positioned with a second pitch;

a main mode of each of the first resonator and the second resonator is a vibration mode in which a resonant frequency decreases with an increase in a thickness of the piezoelectric layer;

where values obtained by multiplying a pitch of electrode fingers, a duty of the electrode fingers, a thickness of the electrode fingers, and a thickness of the piezoelectric layer for the shared reflector, the first resonator, and the second resonator are respectively a fourth value, a fifth value, and a sixth value, the fourth value is the same as both the fifth value and the sixth value or between the fifth value and the sixth value;

a higher-order mode frequency of the first resonator coincides with a higher-order mode frequency of the second resonator;

when a number of the electrode fingers of the shared reflector is even, the electrode finger facing the shared reflector in the first interdigital transducer electrode has a same polarity as a polarity of the electrode finger facing the shared reflector in the second interdigital transducer electrode; and when the number of the electrode fingers of the shared reflector is odd, the electrode finger facing the shared reflector in the first interdigital transducer electrode has a polarity opposite to a polarity of the electrode finger facing the shared reflector in the second interdigital transducer electrode.

17. An acoustic wave device comprising:
a substrate including a piezoelectric layer;
a first resonator on the substrate;
a second resonator on the substrate adjacent to the first resonator and having different frequency characteristics the first resonator; and
a shared reflector on the substrate between the first resonator and the second resonator; wherein
the first resonator includes a first interdigital transducer electrode including electrode fingers positioned with a first pitch;
the second resonator includes a second interdigital transducer electrode including electrode fingers positioned with a second pitch;
a main mode of each of the first resonator and the second resonator is a vibration mode in which a resonant frequency increases with an increase in a thickness of the piezoelectric layer;
where values obtained by multiplying a pitch of electrode fingers, a duty of the electrode fingers, a thickness of the electrode fingers, and an inverse number of a thickness of the piezoelectric layer for the shared reflector, the first resonator, and the second resonator are respectively a first value, a second value, and a third value, the first value is the same as both the second value and the third value or between the second value and the third value;

a higher-order mode frequency of the first resonator coincides with a higher-order mode frequency of the second resonator;

when a number of the electrode fingers of the shared reflector is even, the electrode finger facing the shared reflector in the first interdigital transducer electrode has a same polarity as a polarity of the electrode finger facing the shared reflector in the second interdigital transducer electrode; and when the number of the electrode fingers of the shared reflector is odd, the electrode finger facing the shared reflector in the first interdigital transducer electrode has a polarity opposite to a polarity of the electrode finger facing the shared reflector in the second interdigital transducer electrode.

18. The acoustic wave device according to claim 17, further comprising:
a dielectric layer covering the first resonator, the second resonator, and the shared reflector; wherein
the dielectric layer is made of a material having a bulk wave acoustic velocity higher than an acoustic velocity of a resonant frequency of each of the first resonator and the second resonator; and
where values obtained by multiplying an inverse number of a thickness of the dielectric layer by respective one of the first value to the sixth value for the shared reflector, the first resonator, and the second resonator are respectively a 1b value to a 6b value;
the 1b value is the same as both the 2b value and the 3b value or between the 2b value and the 3b value; or
the 4b value is the same as both the 5b value and the 6b value or between the 5b value and the 6b value.

19. The acoustic wave device according to claim 17, further comprising:
a dielectric layer covering the first resonator, the second resonator, and the shared reflector; wherein
the dielectric layer is made of a material having a bulk wave acoustic velocity lower than an acoustic velocity of a resonant frequency of each of the first resonator and the second resonator; and
where values obtained by multiplying a thickness of the dielectric layer by respective one of the first value to the sixth value for the shared reflector, the first resonator, and the second resonator are respectively a 1a value to a 6a value;
the 1a value is the same as both the 2a value and the 3a value or between the 2a value and the 3a value; or
the 4a value is the same as both the 5a value and the 6a value or between the 5a value and the 6a value.

20. A ladder filter comprising the acoustic wave device according to claim 17.

* * * * *